US012575282B2

(12) United States Patent
Kim et al.

(10) Patent No.: US 12,575,282 B2
(45) Date of Patent: Mar. 10, 2026

(54) TRANSPARENT DISPLAY DEVICE

(71) Applicant: LG Display Co., Ltd., Seoul (KR)

(72) Inventors: TaeHan Kim, Paju-si (KR); ImKuk Kang, Paju-si (KR); Sungho Cho, Paju-si (KR); Suhyeon Cho, Paju-si (KR); DongHo Lee, Paju-si (KR); GeunGi Lee, Paju-si (KR); WooSang Kim, Paju-si (KR); JaeMin Shim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 571 days.

(21) Appl. No.: 17/549,838

(22) Filed: Dec. 13, 2021

(65) Prior Publication Data

US 2022/0199746 A1 Jun. 23, 2022

(30) Foreign Application Priority Data

Dec. 23, 2020 (KR) ........................ 10-2020-0182169
Nov. 8, 2021 (KR) ........................ 10-2021-0152237

(51) Int. Cl.
*H10K 59/35* (2023.01)
*H10K 59/131* (2023.01)
(Continued)

(52) U.S. Cl.
CPC ......... *H10K 59/351* (2023.02); *H10K 59/131* (2023.02); *H10K 59/38* (2023.02);
(Continued)

(58) Field of Classification Search
CPC ......... H10K 2102/3031; H10K 59/131; H10K 59/121; H10K 59/351; H10K 59/353
See application file for complete search history.

(56) References Cited

U.S. PATENT DOCUMENTS

2005/0087769 A1 4/2005 Yamazaki et al.
2012/0139819 A1* 6/2012 Tsai ..................... G09G 3/3225
345/76
(Continued)

FOREIGN PATENT DOCUMENTS

KR 20170027362 A 3/2017
KR 10-2018-0030309 A 3/2018
(Continued)

*Primary Examiner* — Chad M Dicke
*Assistant Examiner* — Jeremy Daniel Watts
(74) *Attorney, Agent, or Firm* — Seed Intellectual Property Law Group LLP

(57) ABSTRACT

A transparent display device has improved transparency. The transparent display device includes a substrate having transmissive areas and a non-transmissive area disposed between the transmissive areas. A first signal line is provided in the non-transmissive area and extended in a first direction. A second signal line is provided in the non-transmissive area and extended in a second direction. A first pixel includes a first subpixel, a second subpixel and a third subpixel, which are overlapped with at least a portion of the second signal line and disposed substantially in a line in the second direction. A second pixel disposed adjacent to the first pixel includes a first subpixel, a second subpixel and a third subpixel, which are overlapped with at least a portion of the second signal line and disposed substantially in a line in the second direction. The first pixel and the second pixel are disposed between two transmissive areas.

27 Claims, 12 Drawing Sheets

(51) Int. Cl.

| | | |
|---|---|---|
| *H10K 59/38* | (2023.01) | |
| *H10K 59/80* | (2023.01) | |
| *H10K 59/88* | (2023.01) | |
| *H10K 102/00* | (2023.01) | |

(52) U.S. Cl.

CPC ......... *H10K 59/88* (2023.02); *H10K 59/8792* (2023.02); *H10K 2102/3031* (2023.02)

(56) References Cited

U.S. PATENT DOCUMENTS

| | | | |
|---|---|---|---|
| 2015/0108455 A1* | 4/2015 | Jung .................... H10K 59/351 257/40 |
| 2016/0028044 A1* | 1/2016 | Kim .................... H10K 59/121 257/40 |
| 2017/0084572 A1* | 3/2017 | Liu ...................... H10K 50/805 |
| 2017/0133620 A1* | 5/2017 | Lee .................. H10K 59/80522 |
| 2017/0221979 A1* | 8/2017 | Chae .................... H10K 59/126 |
| 2018/0076411 A1* | 3/2018 | Kim .................... H10K 59/873 |
| 2018/0166518 A1 | 6/2018 | Kim |
| 2018/0277592 A1* | 9/2018 | Moon .................... H10K 59/30 |
| 2019/0189727 A1* | 6/2019 | Kim .................... H10K 59/121 |
| 2020/0136068 A1 | 4/2020 | Lee et al. |
| 2020/0212131 A1 | 7/2020 | Kim et al. |
| 2021/0249490 A1* | 8/2021 | Lee ...................... H10K 59/123 |
| 2021/0384266 A1* | 12/2021 | Zhao .................... G09G 3/3225 |
| 2023/0157126 A1* | 5/2023 | Jinta ..................... H05B 33/12 257/40 |
| 2023/0343812 A1* | 10/2023 | Zhang .................. H10K 59/121 |

FOREIGN PATENT DOCUMENTS

| | | |
|---|---|---|
| KR | 20180078692 A | 7/2018 |
| KR | 20180108979 A | 10/2018 |
| KR | 20190070767 A | 6/2019 |

* cited by examiner

TRANSPARENT DISPLAY DEVICE

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, an organic light emitting display (OLED) device and a quantum dot light emitting display (QLED) device have been widely utilized.

Recently, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit external light, and a non-transmissive area. The transparent display device may have high light transmittance in the display area through the transmissive area.

BRIEF SUMMARY

The inventors have realized that a transparent display device may improve transparency by increasing a transmissive area. When the transmissive area is increased, the non-transmissive area is reduced. This can cause a difficulty in that a plurality of signal lines and a plurality of driving transistors that should be disposed in a non-transmissive area now should fit in an area of a more narrow size. The present disclosure has been made in view of various technical problems including the above problems, and various embodiments of the present disclosure provide a transparent display device that may improve transparency.

In addition to the technical benefits of the present disclosure as mentioned above, additional technical benefits and features of the present disclosure will be clearly understood by those skilled in the art from the following description of the present disclosure.

In accordance with an embodiment of the present disclosure, the above and other technical benefits can be accomplished by the provision of a transparent display device comprising a substrate having transmissive areas and a non-transmissive area disposed between the transmissive areas, a first signal line provided in the non-transmissive area and extended in a first direction, a second signal line provided in the non-transmissive area and extended in a second direction, and a first pixel including a first subpixel, a second subpixel and a third subpixel. The first subpixel, the second subpixel and the third subpixel are overlapped with the second signal line and disposed substantially in a line in the second direction. A second pixel is disposed adjacent to the first pixel, and includes a first subpixel, a second subpixel and a third subpixel. The first subpixel, the second subpixel and the third subpixel of the second pixel are overlapped with the second signal line and disposed substantially in a line in the second direction. The first pixel and the second pixel are disposed between two of the transmissive areas.

In accordance with another embodiment of the present disclosure, the above and other technical benefits can be accomplished by the provision of a transparent display device comprising a substrate having transmissive areas and a non-transmissive area disposed between the transmissive areas. A first signal line is provided in the non-transmissive area and is extended in a first direction. A second signal line is provided in the non-transmissive area and is extended in a second direction. A plurality of pixels include a plurality of subpixels. The plurality of subpixels are overlapped with at least a portion of the second signal line and are disposed substantially in a line in the second direction. Each of the transmissive areas corresponds to a respective two pixels of the plurality of pixels.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
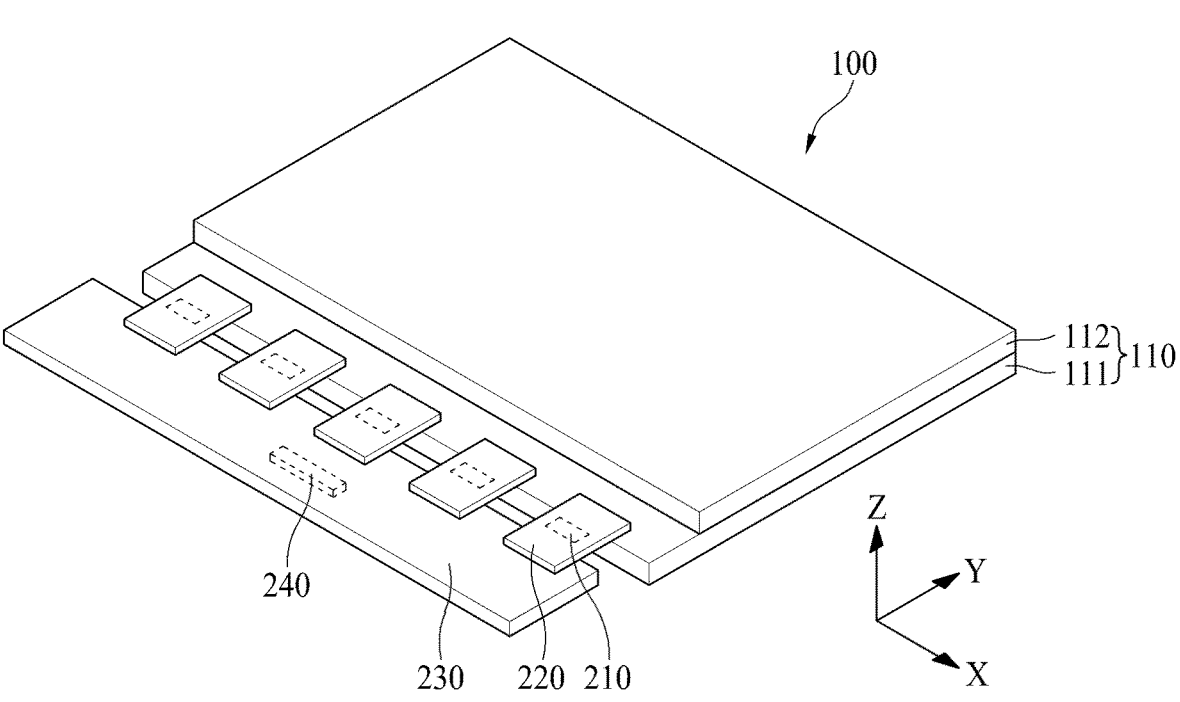
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the technical features of the present disclosure, the detailed description will be omitted. In a case where 'comprise,' 'have,' and 'include' described in the present specification are used, another part may be added unless 'only' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless otherwise mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may each be made of a transparent material.

The scan driver may be provided in one side of the display area of the transparent display panel 110, or the non-display area of both peripheral sides of the transparent display panel 110 by a gate driver in panel (GIP) method. In another way, the scan driver may be manufactured in a driving chip, may be mounted on the flexible film, and may be attached to one peripheral side or both peripheral sides of the display area of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the transparent display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
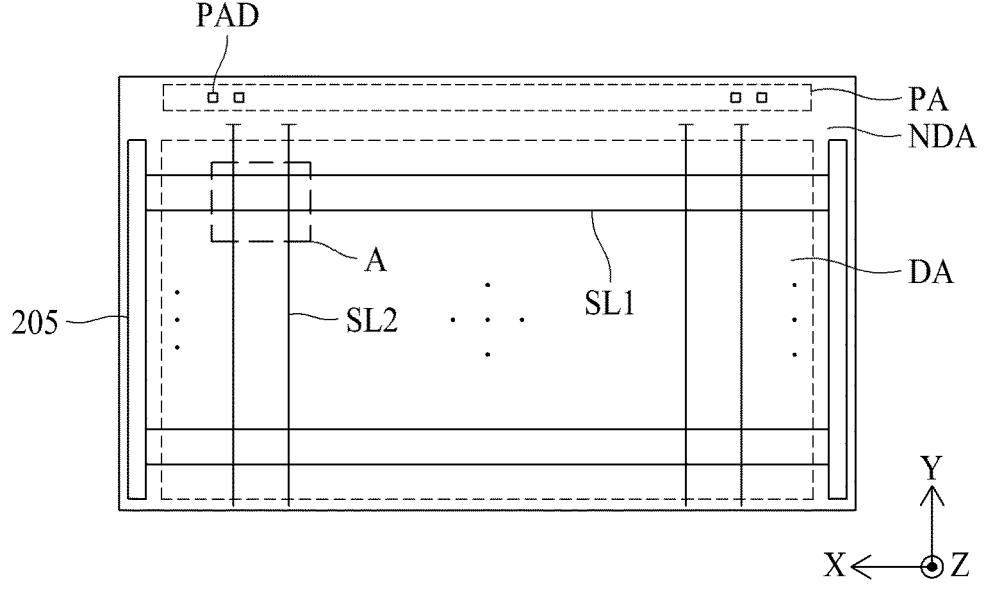
FIG. 2 is a schematic plane view illustrating a transparent display panel according to one embodiment of the present disclosure.
Figure 3:
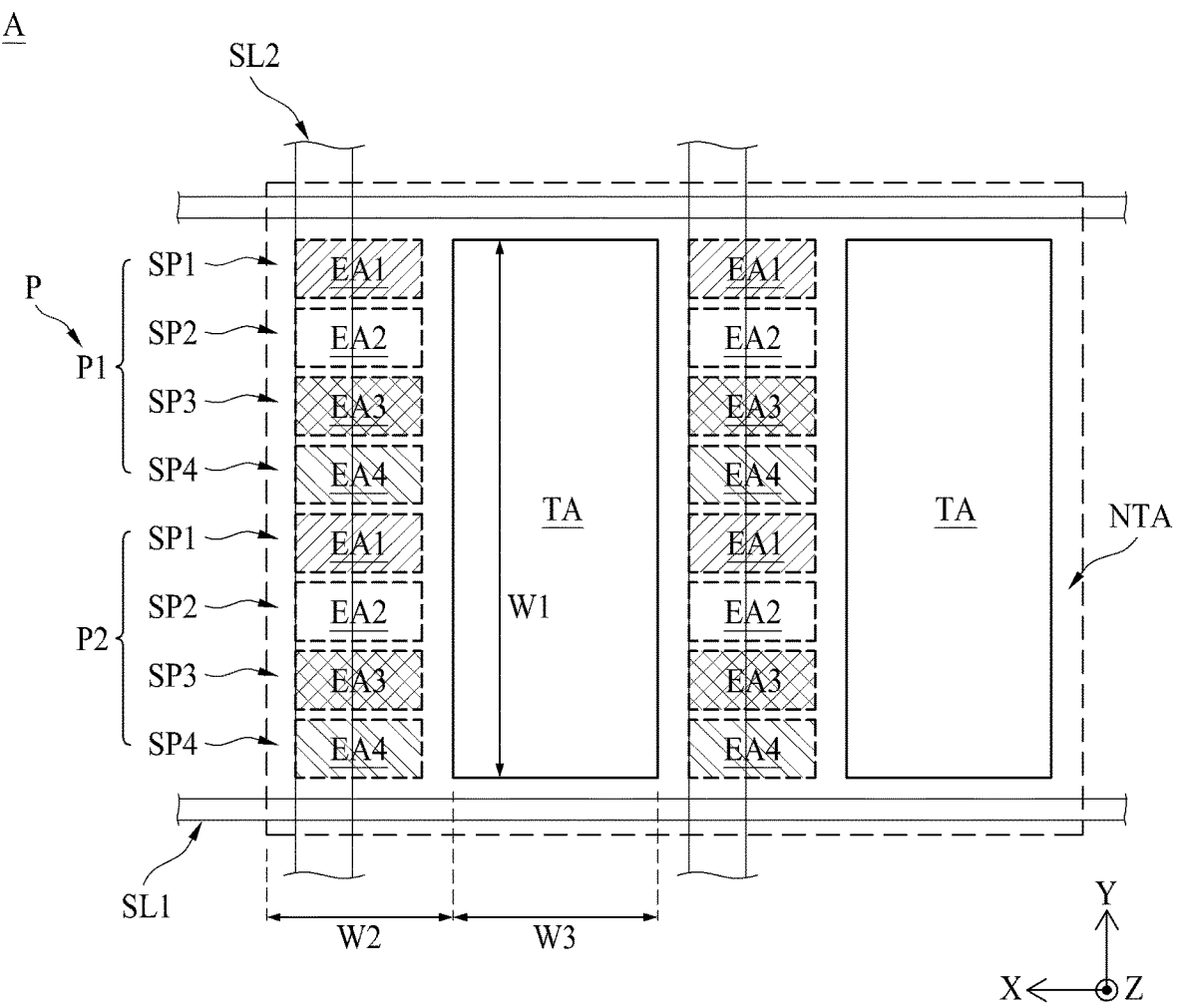
FIG. 3 is an enlarged view illustrating an area A of FIG. 2.
Figure 4:
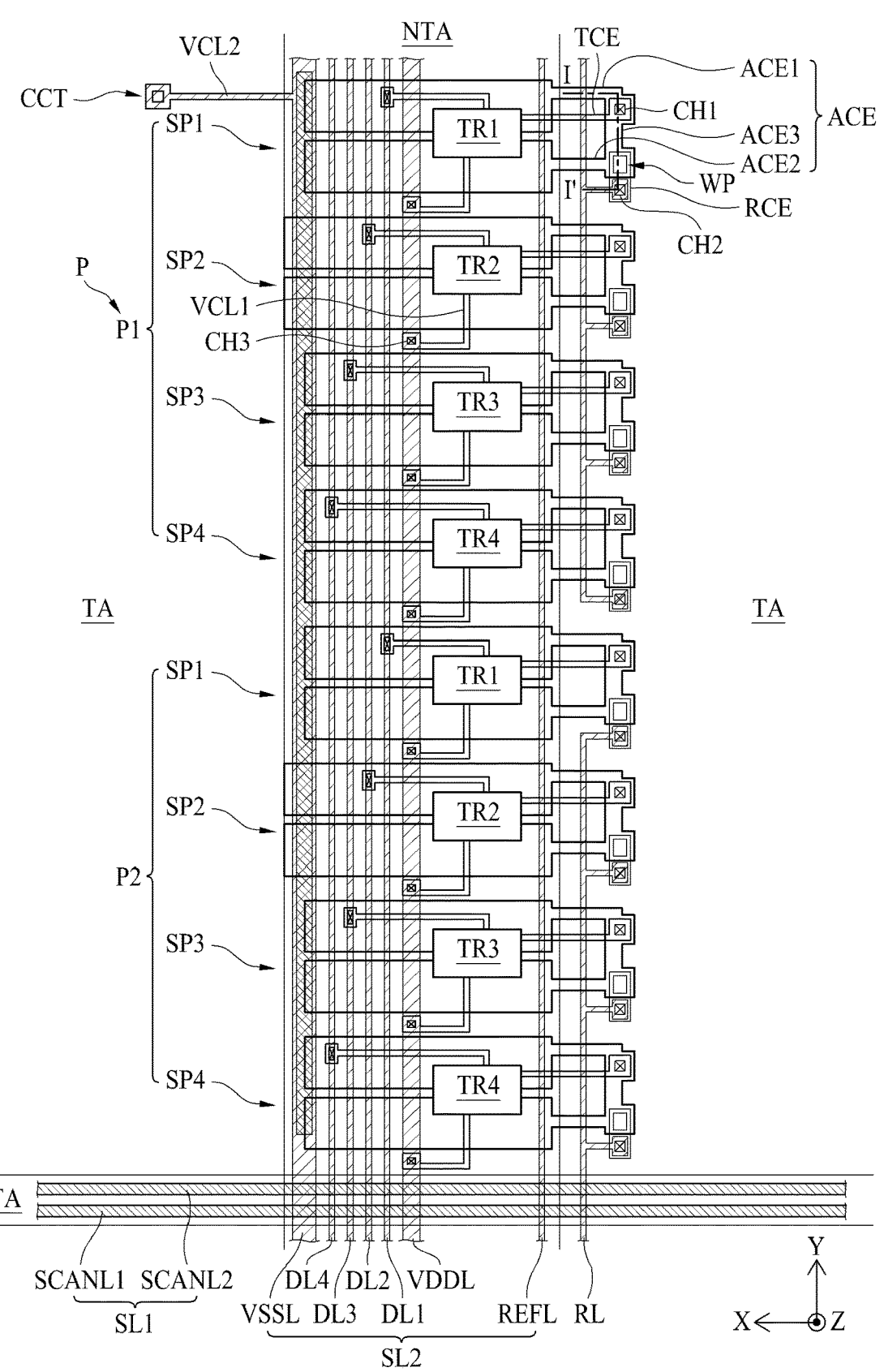
FIG. 4 is a view illustrating an example that a plurality of signal lines and a plurality of driving transistors are disposed.
Figure 5:
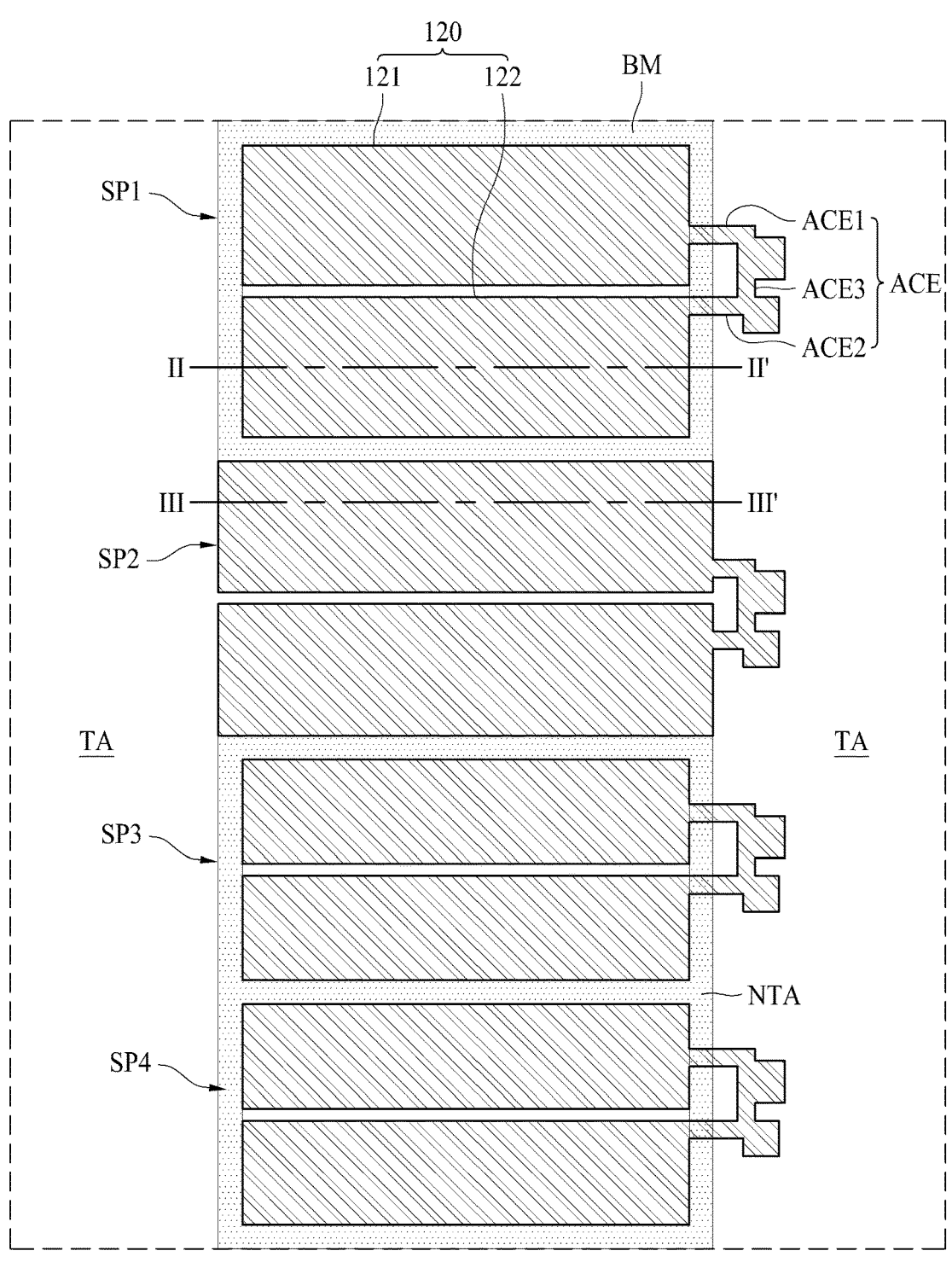
FIG. 5 is a view illustrating an example of an anode electrode and a black matrix, which are provided in subpixels.
Figure 6:
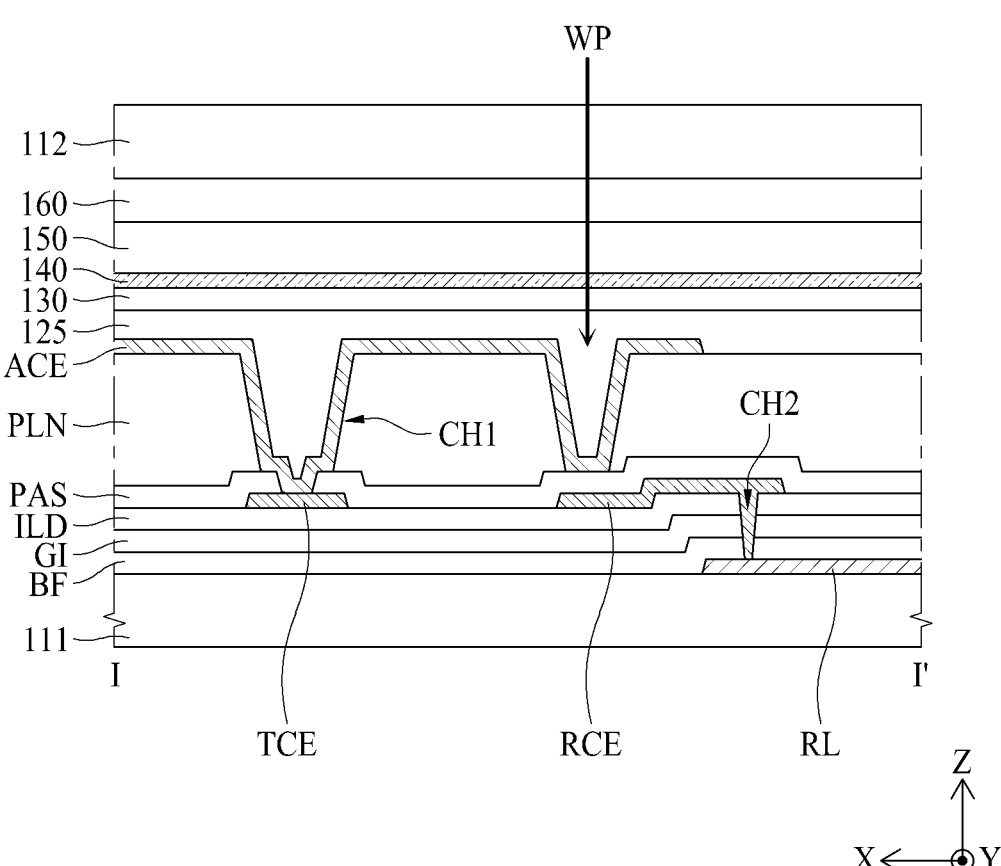
FIG. 6 is a cross-sectional view taken along line I-I' of FIG. 4.
Figure 7:
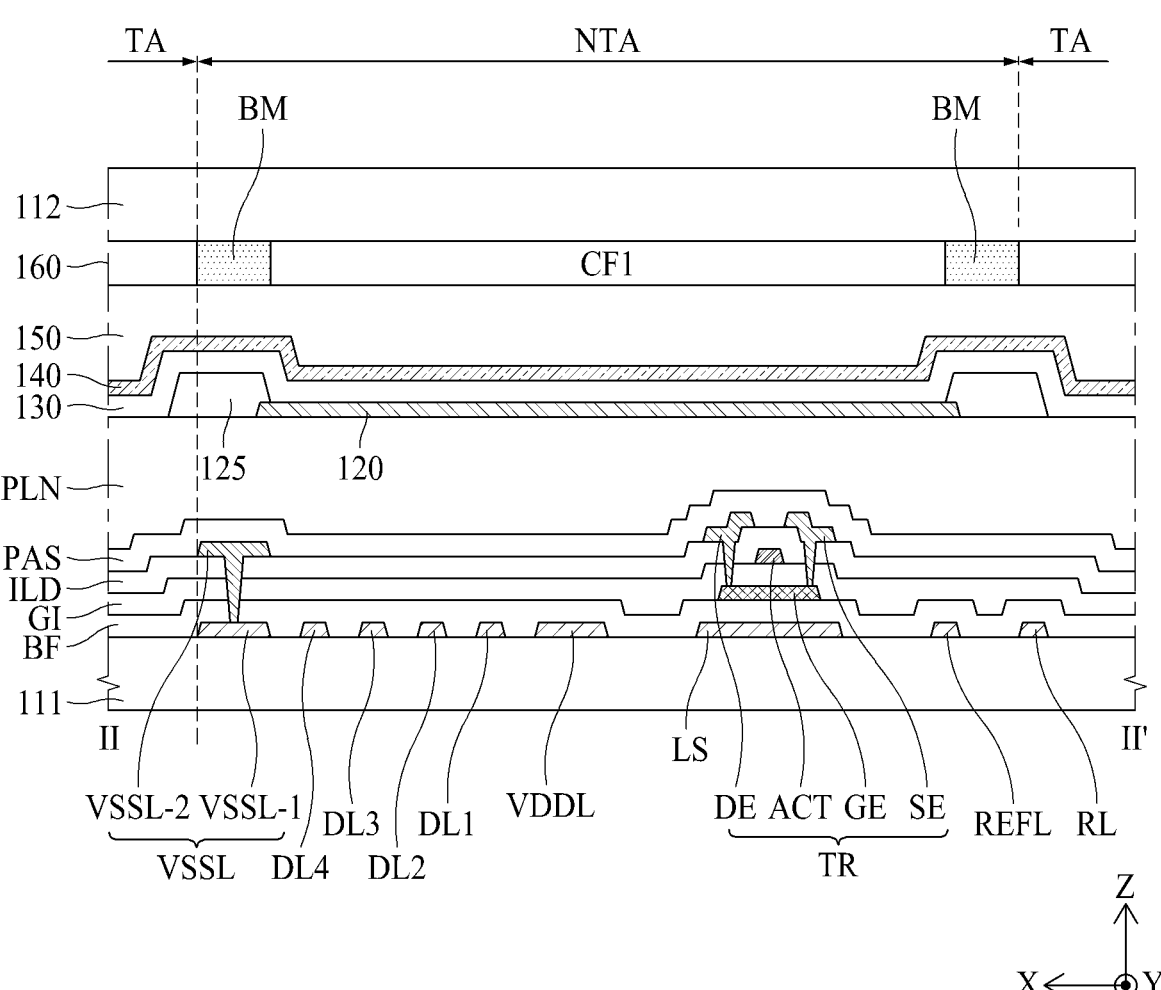
FIG. 7 is a cross-sectional view taken along line II-II' of FIG. 5.
Figure 8:
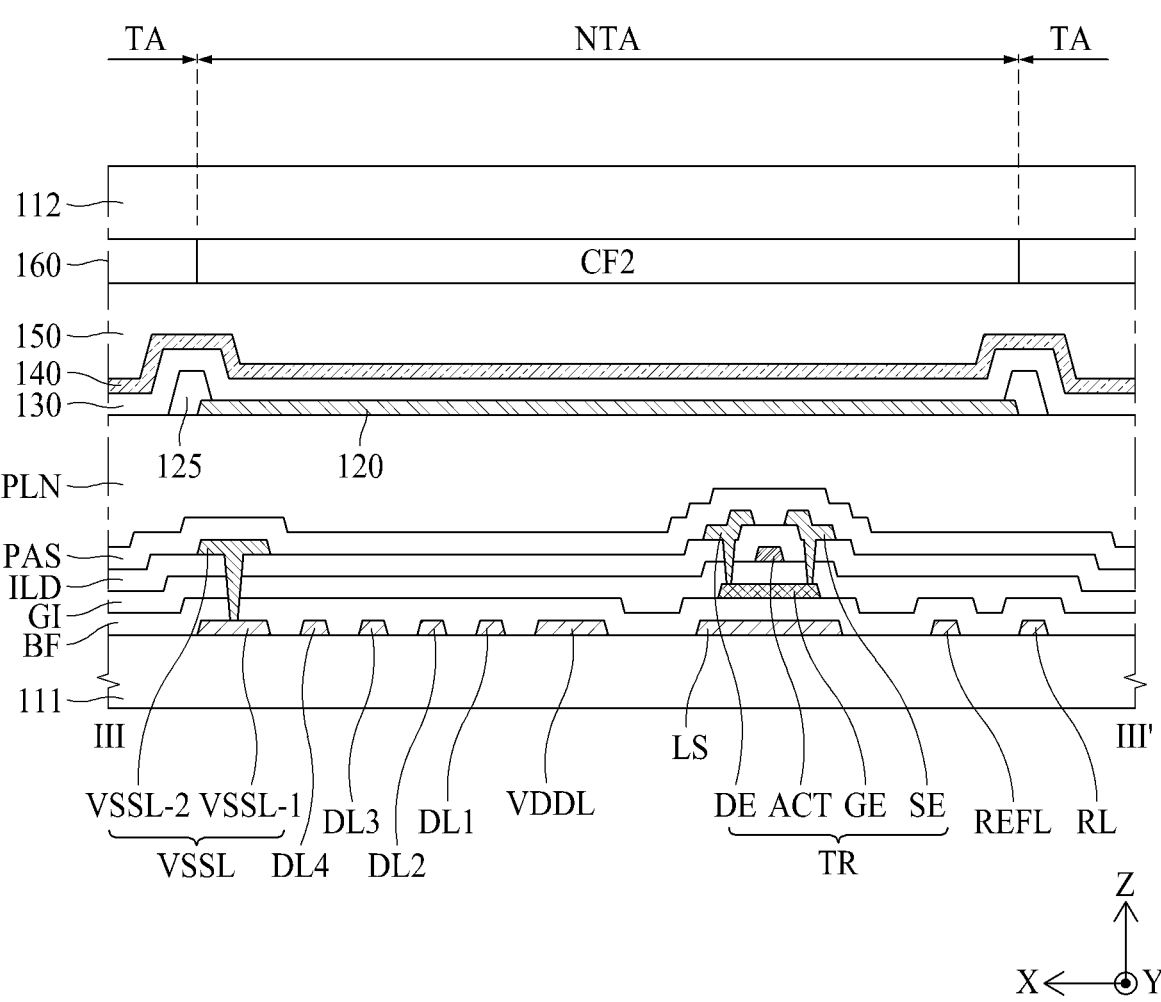
FIG. 8 is a cross-sectional view taken along line III-III' of FIG. 5.
Figure 9:
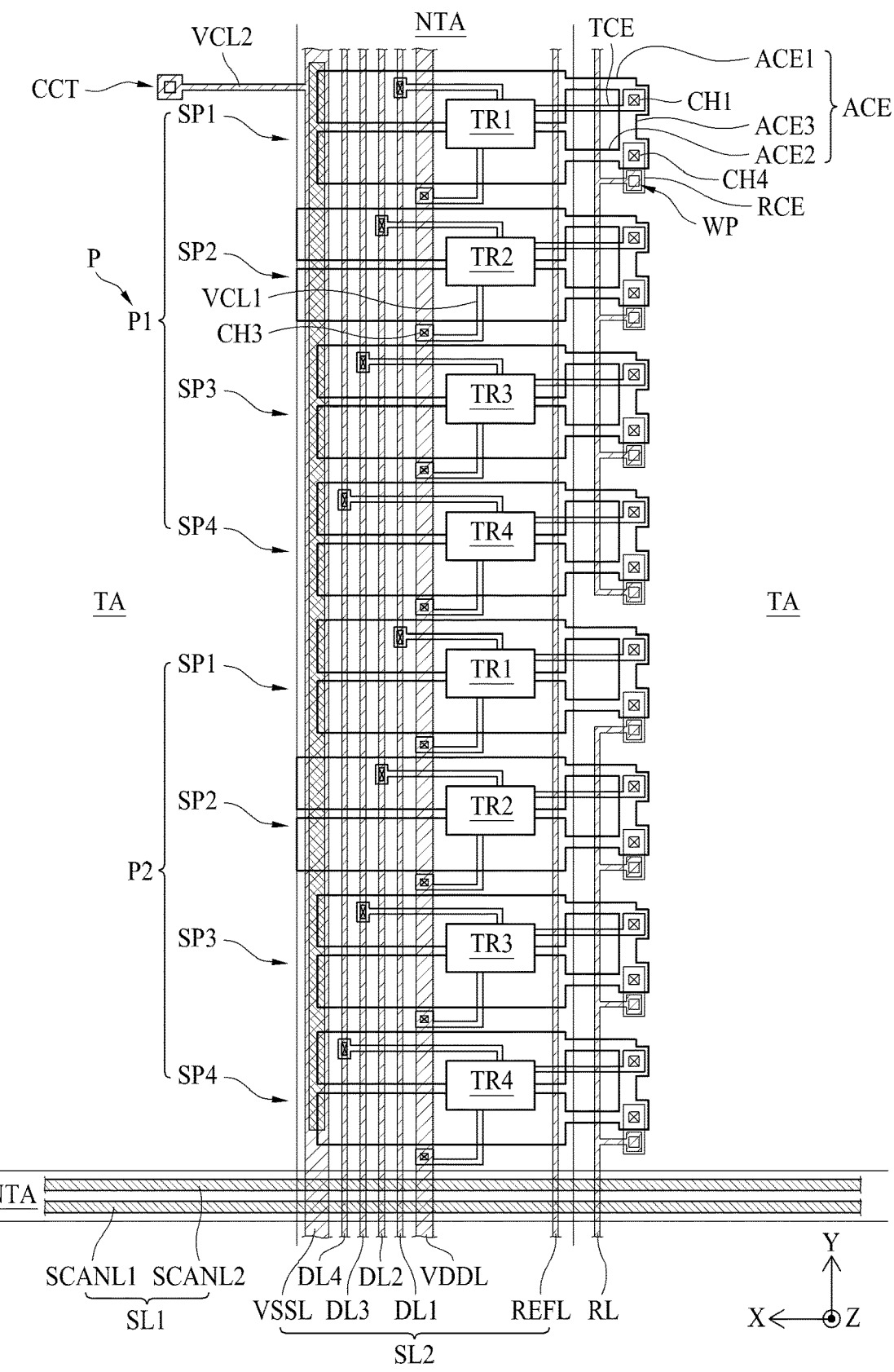
FIG. 9 is a view illustrating a modified example of FIG. 4.
Figure 10:
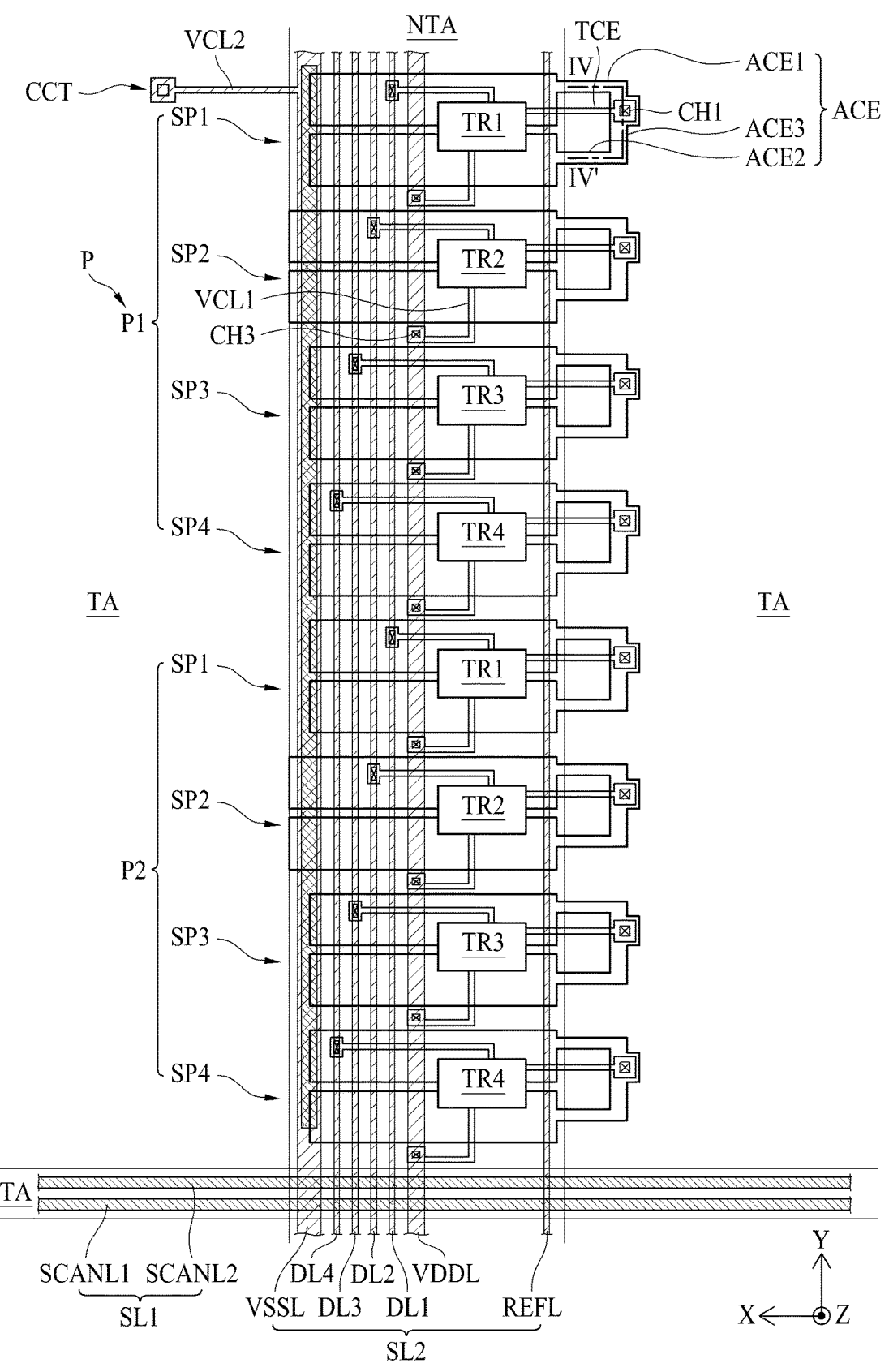
FIG. 10 is a view illustrating another modified example of FIG. 4.
Figure 11:
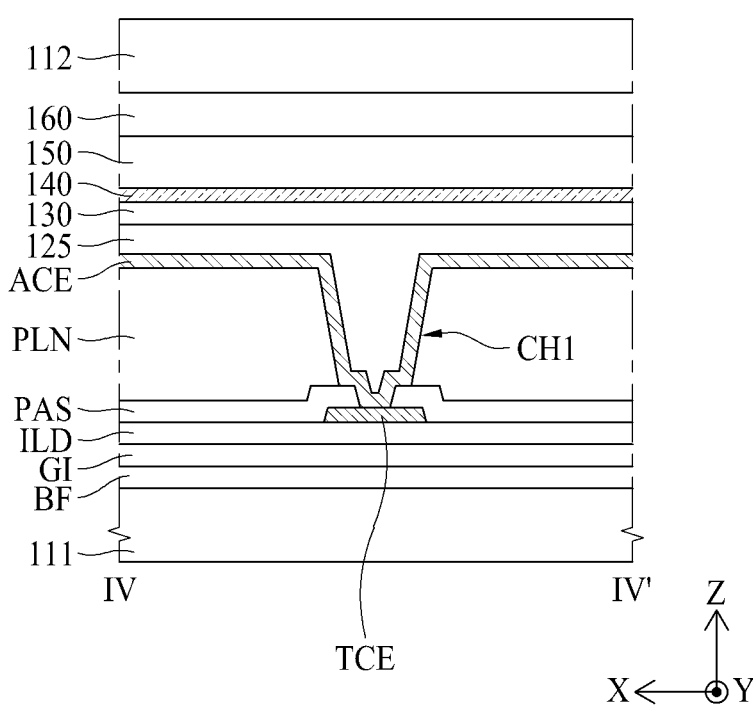
FIG. 11 is a cross-sectional view taken along line IV-IV' of FIG. 10.
Figure 12:
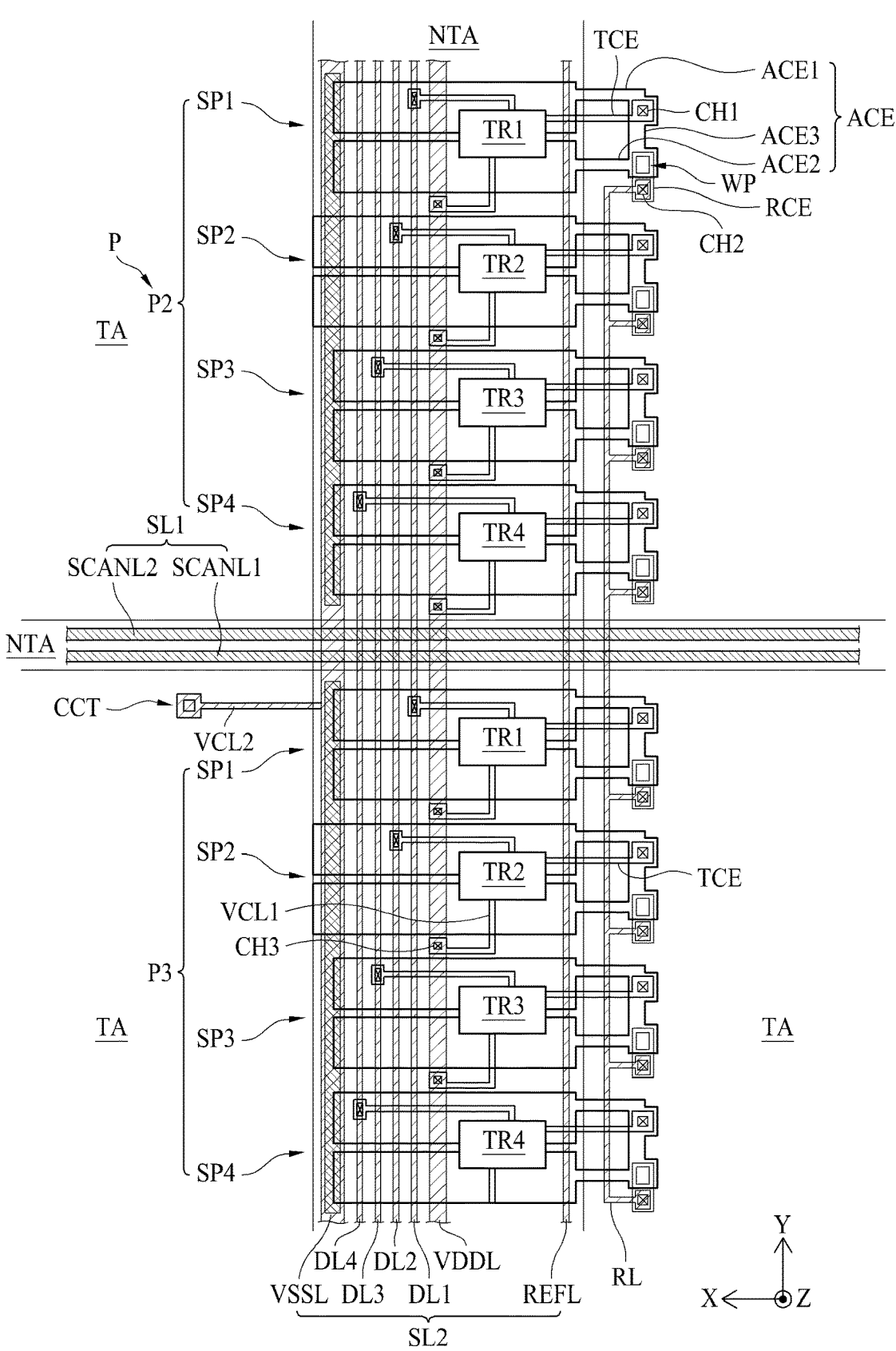
FIG. 12 is a view illustrating an example of a repair line disposed at one side of two adjacent pixels.
Figure 13A:
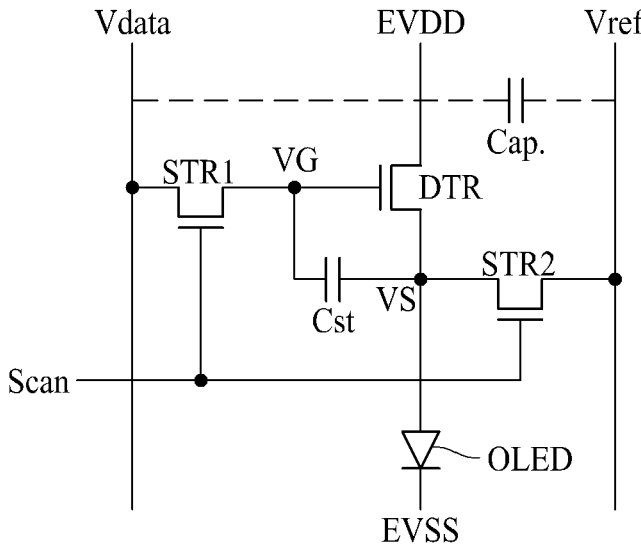
FIG. 13A is a view illustrating parasitic capacitance occurring between a reference line and a data line.
Figure 13B:
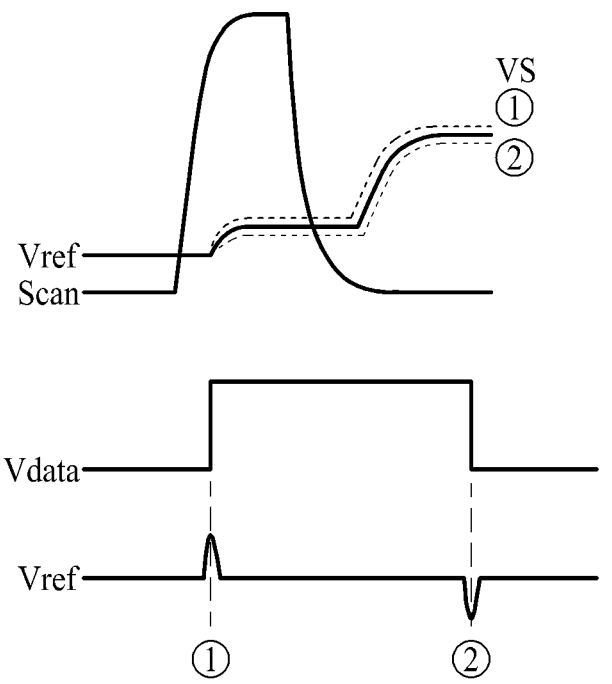
FIG. 13B is a view illustrating a luminance change based on parasitic capacitance.

FIG. 2 is a schematic plane view illustrating a transparent display panel according to one embodiment of the present disclosure, FIG. 3 is an enlarged view illustrating an area A of FIG. 2, FIG. 4 is a view illustrating an example that a plurality of signal lines and a plurality of driving transistors are disposed, FIG. 5 is a view illustrating an example of an anode electrode and a black matrix, which are provided in subpixels, FIG. 6 is a cross-sectional view taken along line I-I' of FIG. 4, FIG. 7 is a cross-sectional view taken along line II-II' of FIG. 5 and FIG. 8 is a cross-sectional view taken along line III-III' of FIG. 5. FIG. 9 is a view illustrating a modified example of FIG. 4, FIG. 10 is a view illustrating another modified example of FIG. 4, FIG. 11 is a cross-sectional view taken along line IV-IV' of FIG. 10. FIG. 12 is a view illustrating an example of a repair line disposed at one side of two adjacent pixels. FIG. 13A is a view illustrating parasitic capacitance occurring between a reference line and a data line and FIG. 13B is a view illustrating a luminance change based on parasitic capacitance.

Referring to FIG. 2 to FIG. 13B, the first substrate 111 may include a display area DA provided with pixels P to display an image, and a non-display area NDA for not displaying an image.

The non-display area NDA may be provided with a pad area PA in which pads PAD are disposed, and at least one scan driver 205.

The scan driver 205 is connected to the scan lines SL and supplies scan signals to the scan lines SL. The scan driver 205 may be disposed in one side of the display area DA of the transparent display panel 110, or the non-display area NDA of both peripheral sides of the transparent display panel 110 by a gate driver in panel (GIP) method. For example, as shown in FIG. 2, the scan driver 205 may be provided in both side of the display area DA of the transparent display panel 110, but these scan drivers are not limited thereto. The scan driver 205 may be provided on a single side of the display area DA of the transparent display panel 110.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, about 90%, and the non-transmissive area NTA may be an area where light transmittance is smaller than β%, for example, about 50%. At this time, α is greater than β. A user may view an object or background arranged over a rear surface of the transparent display panel 110 due to the transmissive area TA.

The non-transmissive area NTA may include a plurality of pixels P, and a plurality of first and second signal lines SL1 and SL2 for supplying signals to the plurality of pixels P, respectively.

The plurality of first signal lines SL1 may be extended in a first direction (e.g., X-axis direction). The plurality of first signal lines SL1 may cross the plurality of second signal lines SL2. Each of the plurality of first signal lines SL1 may include at least one scan line, such as scan lines SCANL1 and SCANL2 shown in FIG. 4.

Hereinafter, when the first signal line SL1 includes a plurality of lines, the first signal line SL1 may refer to a signal line group including a plurality of lines. For example, one first signal line SL1 may refer to a signal line group including two scan lines SCANL1 and SCANL2.

The plurality of second signal lines SL2 may be extended in a second direction (e.g., Y-axis direction). Each of the plurality of second signal lines SL2 may include at least one of data lines DL1, DL2, DL3 and DL4, a pixel power line VDDL, a reference line REFL and a common power line VSSL.

Hereinafter, when the second signal line SL2 includes a plurality of lines, the second signal line SL2 may refer to a signal line group including a plurality of lines. For example, one second signal line SL2 may refer to a signal line group including four data lines DL1, DL2, DL3 and DL4, a pixel power line VDDL, a reference line REFL and a common power line VSSL.

A transmissive area TA may be disposed between the first signal lines SL1 adjacent to each other. In addition, the transmissive area TA may be disposed between the second signal lines SL2 adjacent to each other. As a result, the transmissive area TA may be surrounded by two first signal lines SL1 and two second signal lines SL2.

Pixels P (see FIG. 3) may be provided to overlap at least one of the first signal line SL1 and the second signal line SL2, thereby emitting predetermined light or selected light to display an image. An emission area EA may correspond to an area, from which light is emitted, in the pixel P.

Each of the pixels P may include at least one of a first subpixel SP1, a second subpixel SP2, a third subpixel SP3 and a fourth subpixel SP4. The first subpixel SP1 may include a first emission area EA1 emitting light of a red color. The second subpixel SP2 may include a second emission area EA2 emitting light of a white color. The third subpixel SP3 may include a third emission area EA3 emitting light of a blue color. The fourth subpixel SP4 may include a fourth emission area EA4 emitting light of a green color. However, the emission areas are not limited to this example. Also, the arrangement order of the subpixels P1, P2, P3 and P4 may be changed in various ways.

Hereinafter, for convenience of description, the description will be given based on that a first subpixel SP1 is a red subpixel emitting red light, a second subpixel SP2 is a white subpixel emitting white light, a third subpixel SP3 is a blue subpixel emitting blue light, and a fourth subpixel SP4 is a green subpixel emitting green light. It is understood that each of the first, second, third and fourth subpixels SP1, SP2, SP3, SP4 is configured to emit light when driven by a selected voltage or selected current, that emission of the light may vary based on level of the selected voltage or selected current, and that each of the first, second, third and fourth subpixels SP1, SP2, SP3, SP4 may not emit light when driven by a sufficiently low voltage or sufficiently low current (e.g., in the absence of a driving voltage or a driving current).

Each of the plurality of pixels P may be provided in a non-transmissive area NTA disposed between the transmissive areas TA. The plurality of pixels P may be disposed to be adjacent to each other in the non-transmissive area NTA in the second direction (e.g., Y-axis direction). In detail, the plurality of pixels P may include a first pixel P1 provided in the non-transmissive area NTA and a second pixel P2 disposed to be adjacent to the first pixel P1 in the second direction. Each of the first pixel P1 and the second pixel P2 may include a first subpixel SP1, a second subpixel SP2 and a third subpixel SP3, and may further include a fourth subpixel SP3 in accordance with one embodiment.

The first pixel P1 and the second pixel P2, which are disposed to be adjacent to each other in the second direction, may be disposed between two adjacent transmissive areas TA in the first direction. In addition, the first pixel P1 and the second pixel P2, which are disposed to be adjacent to each other in the second direction, may be disposed between two adjacent first signal lines SL1 in the second direction. As a result, one transmissive area TA may correspond to two pixels P1 and P2.

In the transparent display panel 110 according to one embodiment of the present disclosure, two pixels P1 and P2 may be provided to correspond to one transmissive area TA, whereby a size of the transmissive area TA may be increased, and transparency may be improved.

Meanwhile, the first subpixel SP1, the second subpixel SP2, the third subpixel SP3 and the fourth subpixel SP4, which are provided in each of the first pixel P1 and the second pixel P2, may be disposed substantially in a line in the second direction. In detail, the first subpixel SP1, the second subpixel SP2, the third subpixel SP3 and the fourth subpixel SP4, which are provided in the first pixel P1, may be disposed substantially in a line in the second direction. The first subpixel SP1, the second subpixel SP2, the third subpixel SP3 and the fourth subpixel SP4, which are provided in the second pixel P2, may be disposed substantially in a line in the second direction. Therefore, the four subpixels SP1, SP2, SP3 and SP4 provided in the first pixel P1 and the four subpixels SP1, SP2, SP3 and SP4 provided in the second pixel P2, that is, a total of eight subpixels may be disposed substantially in a line in the second direction between two adjacent first signal lines SL1, as shown in FIG. 3. The reference in the specification to the pixels, or in some instances, the subpixels, being substantially in a line means that they are generally in a line with each other. They do not need to be exactly lined up, but are generally aligned with each other.

As described above, each of the first subpixel SP1, the second subpixel SP2, the third subpixel SP3 and the fourth subpixel SP4 may include a circuit element including a capacitor, a thin film transistor and the like, a plurality of signal lines for supplying a signal to the circuit element, and a light emitting element. The thin film transistor may include a switching transistor, a sensing transistor and driving transistors TR1, TR2, TR3 and TR4 (shown in FIG. 4).

In the transparent display panel 110, the plurality of signal lines as well as the first subpixel SP1, the second subpixel SP2, the third subpixel SP3 and the fourth subpixel SP4 should be disposed in the non-transmissive area NTA except the transmissive area TA. Therefore, the first subpixel SP1, the second subpixel SP2, the third subpixel SP3 and the fourth subpixel SP4 overlap at least one of the first signal line SL1 and the second signal line SL2. As shown in FIG. 3, the first, second, third and fourth subpixels SP1, SP2, SP3, SP4 are present in the non-transmissive area NTA, and the transmissive area TA is substantially free of subpixels.

Although FIG. 3 shows that the first subpixel SP1, the second subpixel SP2, the third subpixel SP3 and the fourth subpixel SP4 overlap at least a portion of the second signal line SL2 but do not overlap the first signal line SL1, the embodiment of the present disclosure is not limited thereto. In another embodiment, a portion of the first subpixel SP1, the second subpixel SP2, the third subpixel SP3 and the fourth subpixel SP4 may partially overlap the first signal line SL1. For example, a portion of the first subpixel SP1 adjacent to the first signal line SL1 may partially overlap the first signal line SL1.

The plurality of signal lines may include a first signal line SL1 extended in a first direction (e.g., X-axis direction) and a second signal line SL2 extended in a second direction (e.g., Y-axis direction) as described above.

The first signal line SL1 may include a first scan line SCANL1 and a second scan line SCANL2, as shown in FIG. 4. The first scan line SCANL1 may supply a scan signal to the subpixels SP1, SP2, SP3 and SP4 of the pixel P disposed at a first side, for example, a lower side. The second scan line SCANL2 may supply a scan signal to the subpixels SP1, SP2, SP3 and SP4 of the pixel P disposed at a second side, for example, an upper side.

Therefore, as shown in FIG. 4, the first pixel P1 and the second pixel P2 may be provided between the first scan line SCANL1 included in one first signal line SL1 and the second scan line SCANL2 included in the other first signal line SL1 adjacent to the first signal line SL1. The first pixel P1 may be supplied with the scan signal from the first scan line SCANL1 disposed at an upper side, and the second pixel P2 may be supplied with the scan signal from the second scan line SCANL2 disposed at a lower side.

The second signal line SL2 may include at least one of data lines DL1, DL2, DL3 and DL4, a pixel power line VDDL, a reference line REFL and a common power line VSSL, as shown in FIG. 4, but is not limited thereto.

The reference line REFL may supply a reference voltage (or an initialization voltage or a sensing voltage) to the driving transistors TR1, TR2, TR3 and TR4 of the subpixels SP1, SP2, SP3 and SP4 provided in the display area DA.

Each of at least one of the data lines DL1, DL2, DL3 and DL4 may supply a data voltage to at least one of the subpixels SP1, SP2, SP3 and SP4 provided in the display area DA. For example, the first data line DL1 may supply a first data voltage to the first driving transistor TR1 of the first subpixel SP1, the second data line DL2 may supply a second data voltage to the second driving transistor TR2 of the second subpixel SP2, the third data line DL3 may supply a third data voltage to the third driving transistor TR3 of the third subpixel SP3, and the fourth data line DL4 may supply a fourth data voltage to the fourth driving transistor TR4 of the fourth subpixel SP4.

The pixel power line VDDL may supply a first power source to an anode electrode 120 of each of the subpixels SP1, SP2, SP3 and SP4. The common power line VSSL may supply a second power source to a cathode electrode 140 of each of the subpixels SP1, SP2, SP3 and SP4.

When the second signal line SL2 includes the common power line VSSL, since a higher voltage is applied to the common power line VSSL than the other signal lines, it is preferable that the common power line VSS has a wider area than the other signal lines. The common power line VSSL may be formed as a double layer to make sure of a wide area. For example, the common power line VSSL may include a first common power line VSSL-1 and a second common power line VSSL-2, as shown in FIG. 6. The first common power line VSSL-1 and the second common power line VSSL-2 may electrically be connected with each other through a plurality of first contact portions CT1. Although not shown in FIGS. 4, 7 and 8, the pixel power line VDDL may also be formed as a double layer.

The switching transistor is switched in accordance with the scan signal supplied to the scan lines SCANL1 and SCANL2 to supply the data voltages supplied from the data lines DL1, DL2, DL3 and DL4 to the driving transistors TR1, TR2, TR3 and TR4.

The sensing transistor serves to sense a deviation in threshold voltages of the driving transistors TR1, TR2, TR3 and TR4, which causes deterioration of image quality.

The driving transistors TR1, TR2, TR3 and TR4 are switched in accordance with the data voltage supplied from the switching thin film transistor to generate a data current from a power source supplied from the pixel power line VDDL and supply the data current to the anode electrode 120 of the subpixel. The driving transistors TR1, TR2, TR3 and TR4 are provided for each of the subpixels SP1, SP2, SP3 and SP4, and include an active layer ACT, a gate electrode GE, a source electrode SE and a drain electrode DE (see FIG. 6). In detail, the first driving transistor TR1 may supply the data current to the anode electrode 120 of the first subpixel SP1, and the second driving transistor TR2 may supply the data current to the anode electrode 120 of the second subpixel SP2. The third driving transistor TR3 may supply the data current to the anode electrode 120 of the third subpixel SP3, and the fourth driving transistor TR4 may supply the data current to the anode electrode 120 of the fourth subpixel SP4.

The capacitor serves to maintain the data voltage supplied to the driving transistors TR1, TR2, TR3 and TR4 for one frame. The capacitor may include, but is not limited to, a first capacitor electrode and a second capacitor electrode. In another embodiment, the capacitor may include three capacitor electrodes.

Referring to FIGS. 6 to 8, an active layer ACT may be provided over a first substrate 111. The active layer ACT may be formed of a silicon-based semiconductor material or an oxide-based semiconductor material.

A light shielding layer LS for shielding external light incident on the active layer ACT may be provided between the active layer ACT and the first substrate 111. The light-shielding layer LS may be formed of a material having conductivity, and may be formed of a single layer or multi-layer made of one of molybdenum (Mo), aluminum (Al), chromium (Cr), gold (Au), titanium (Ti), nickel (Ni), neodymium (Nd) and copper (Cu), or their alloy. In this case, a buffer layer BF may be provided between the light shielding layer LS and the active layer ACT.

A gate insulating layer GI may be provided over the active layer ACT. The gate insulating layer GI may be formed of an inorganic film, for example, a silicon oxide film (SiOX), a silicon nitride film (SiNx), or a multi-film of SiOx and SiNx.

In addition, at least one of the plurality of signal lines may be provided in the same layer as the light shielding layer LS. For example, the pixel power line VDDL, the first data line DL1, the second data line DL2, the third data line DL3, the fourth data line DL4, the first common power line VSS-1 and the reference line REFL may be formed of the same material as that of the light shielding layer LS on the same layer as the light shielding layer LS, but are not limited thereto.

In FIGS. 7 and 8, the pixel power line VDDL, the first data line DL1, the second data line DL2, the third data line DL3, the fourth data line DL4, the first common power line VSSL-1 and the reference line REFL are disposed in the light shielding layer LS, but are not limited thereto. In another embodiment, the first pixel power line VDDL-1, the first data line DL1, the second data line DL2, the third data line DL3, the fourth data line DL4, the first common power line VSSL-1 and the reference line REFL may be disposed in one or more of any of the layers in which the light shielding layer LS, the gate electrode GE, the source electrode SE and the drain electrode DE are formed.

A gate electrode GE may be provided over the gate insulating layer GI. The gate electrode GE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE. The interlayer dielectric layer ILD may be formed of an inorganic film, for example, a silicon oxide film (SiOX), a silicon nitride film (SiNx), or a multi-film of SiOx and SiNx.

The source electrode SE and the drain electrode DE may be provided over the interlayer dielectric layer ILD. The source electrode SE and the drain electrode DE may be connected to the active layer ACT through a contact hole that passes through the gate insulating layer GI and the interlayer dielectric layer ILD.

The source electrode SE and the drain electrode DE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

In addition, at least one of the plurality of signal lines may be provided in the same layer as the source electrode SE and the drain electrode DE. For example, the second common power line VSSL-2 may be formed of the same material as that of the source electrode SE and the drain electrode DE in the same layer as the source electrode SE and the drain electrode DE, but is not limited thereto.

A passivation layer PAS for protecting the driving transistors TR1, TR2, TR3 and TR4 may be provided over the source electrode SE and the drain electrode DE. A planarization layer PLN for planarizing a step difference due to the driving transistors TR1, TR2, TR3 and TR4 may be provided over the passivation layer PAS. The planarization layer PLN may be formed of an organic layer such as an acrylic resin, an epoxy resin, a phenolic resin, a polyamide resin and a polyimide resin.

Light emitting elements comprised of an anode electrode 120, a light emitting layer 130 and a cathode electrode 140, and a bank 125 are provided over the planarization layer PLN.

The anode electrode 120 may be provided over the planarization layer PLN and then connected with the driving transistors TR1, TR2, TR3 and TR4. In detail, the anode electrode 120 may be connected to the source electrode SE or the drain electrode of the driving transistors TR1, TR2, TR3 and TR4 through a first contact hole CH1 (see FIG. 4) that passes through the planarization layer PLN and the passivation layer PAS. Therefore, the anode electrode 120 may electrically be connected with the driving transistors TR1, TR2, TR3 and TR4.

The anode electrode 120 may be provided for each of the subpixels SP1, SP2, SP3 and SP4, and may be not provided in the transmissive area TA.

The anode electrode 120 may be formed of a metal material having high reflectance, such as a deposited structure (Ti/Al/Ti) of Al and Ti, a deposited structure (ITO/Al/ITO) of aluminum and ITO, an Ag alloy and a deposited structure (ITO/Ag alloy/ITO) of Ag alloy and ITO, MoTi alloy and a deposited structure (ITO/MoTi alloy/ITO) of MoTi alloy and ITO. The Ag alloy may be an alloy of silver (Ag), palladium (Pb), and Copper (Cu). The MoTi alloy may be an alloy of molybdenum (Mo) and titanium (Ti).

The anode electrode 120 provided in each of the plurality of subpixels SP1, SP2, SP3 and SP4 may be provided in a plural number. For example, as shown in FIG. 5, the anode electrode 120 provided in each of the plurality of subpixels SP1, SP2, SP3 and SP4 may include a first anode electrode 121 and a second anode electrode 122. The first anode electrode 121 and the second anode electrode 122 may be spaced apart from each other in the same layer.

The transparent display panel 110 according to one embodiment of the present disclosure may further include an anode connection electrode ACE for connecting the first anode electrode 121 with the second anode electrode 122. As shown in FIG. 4, the anode connection electrode ACE may include a first anode connection portion ACE1, a second anode connection portion ACE2, and a third anode connection portion ACE3. The anode connection electrode ACE is also shown in FIG. 5.

The first anode connection portion ACE1 may be extended from the first anode electrode 121 as much as a predetermined length or selected length. The second anode connection portion ACE2 may be extended from the second anode electrode 122 toward the transmissive area TA as much as a predetermined length or selected length.

The third anode connection portion ACE3 may connect one end of the first anode connection portion ACE1 with one end of the second anode connection portion ACE2. The first anode connection portion ACE1, the second anode connection portion ACE2, and the third anode connection portion ACE3 may be formed as one body on the same layer as the first anode electrode 121 and the second anode electrode 122. Therefore, the first anode electrode 121 may electrically be connected with the second anode electrode 122 through the anode connection electrode ACE.

The transparent display panel 110 according to one embodiment of the present disclosure may further include a repair connection electrode RCE for connecting the anode electrode 120 and a repair line RL.

One end of the repair connection electrode RCE, as shown in FIG. 4, may be connected to the repair line RL through a second contact hole CH2, and the other end thereof may overlap at least a portion of the third anode connection portion ACE3 to form a welding point WP. At this time, the repair connection electrode RCE electrically connected to the repair line RL may electrically be separated from the third anode connection portion ACE3 with at least one insulating layer interposed therebetween at the welding point WP. That is, the repair line RL may electrically be separated from the third anode connection portion ACE3.

In detail, the repair connection electrode RCE, as shown in FIG. 6, may electrically be separated from the third anode connection portion ACE3 with at least one insulating layer, for example, the passivation layer PAS, which are interposed therebetween. When a defective subpixel occurs, the repair connection electrode RCE and the third anode connection portion ACE3, which are electrically separated from each other, may electrically be connected with each other by a repair process. As a result, the repair line RL and the third anode connection portion ACE3 may be electrically connected.

In FIG. 4, one end of the repair connection electrode RCE is connected to the repair line RL through the second contact hole CH2, and the other end thereof may overlap at least a portion of the third anode connection portion ACE3, but is not limited thereto.

In another embodiment, one end of the repair connection electrode RCE may overlap at least a portion of the repair line RL to form the welding point WP, and the other end thereof may be connected to the third anode connection portion ACE3 through the fourth contact hole CH4, as shown in FIG. 9. At this time, the repair connection electrode RCE may electrically be separated from the repair line RL with at least one insulating layer interposed therebetween at the welding point WP. That is, the repair line RL may electrically be separated from the third anode connection portion ACE3. For example, the repair connection electrode RCE may electrically be separated from the repair line RL with at least one insulating layer, for example, the planarization layer PLN and the passivation layer PAS, which are interposed therebetween. When a defective subpixel occurs, the repair connection electrode RCE and the repair line RL, which are electrically separated from each other, may electrically be connected with each other by a repair process.

The repair connection electrode RCE may be provided in the same layer as the source electrode SE or the drain electrode DE of the driving transistors TR1, TR2, TR3 and TR4.

The first anode connection portion ACE1, the second anode connection portion ACE2, the third anode connection portion ACE3 and the repair connection electrode RCE may be positioned in the non-transmissive areas NTA, but are not limited thereto. In another embodiment, the first anode connection portion ACE1, the second anode connection portion ACE2, the third anode connection portion ACE3 and the repair connection electrode RCE may be made of a transparent conductive material. In this case, areas in which the first anode connection portion ACE1, the second anode connection portion ACE2, the third anode connection portion ACE3 and the repair connection electrode RCE may be provided in the transmissive areas TA, as shown in FIG. 4 and in FIG. 5.

The anode electrode 120 may electrically be connected with the driving transistors TR1, TR2, TR3 and TR4 through the anode connection electrode ACE and a transistor connection electrode TCE, shown in FIG. 4.

The transistor connection electrode TCE may be disposed between the first anode connection portion ACE1 and the second anode connection portion ACE2. The transistor connection electrode TCE may be extended from the source electrode SE or the drain electrode DE of the driving transistors TR1, TR2, TR3 and TR4 toward the transmissive area TA as much as a predetermined length or selected length. At least a portion of the transistor connection electrode TCE, as shown in FIG. 6, may overlap the third anode connection portion ACE3, and may electrically be connected with the third anode connection portion ACE3 in an area overlapped with the third anode connection portion ACE3, through the first contact hole CH1.

The area in which the transistor connection electrode TCE is provided may be the non-transmissive area NTA, but is not limited thereto. The transmissive area TA may be provided between the transistor connection electrode TCE and the first anode connection portion ACE1 and between the transistor connection electrode TCE and the second anode connection portion ACE2. In another embodiment, the transistor connection electrode TCE may be made of a transparent conductive material. In this case, the area in which the transistor connection electrode TCE is provided may be the transmissive area TA.

In the transparent display panel 110 according to one embodiment of the present disclosure, particles may enter any one of the first anode electrode 121 and the second anode electrode 122 during a process, whereby a dark spot may occur. In this case, the transparent display panel 110 according to one embodiment of the present disclosure may be repaired by cutting at least one of the first anode connection portion ACE1 and the second anode connection portion ACE2 of the anode connection electrode ACE.

For example, when a short occurs between the first anode electrode 121 and the cathode electrode 140 due to particles in the area in which the first anode electrode 121 is provided, the transparent display panel 110 according to one embodiment of the present disclosure may be repaired by cutting the first anode connection layer ACE1 using a laser.

For another example, when a short occurs between the second anode electrode 122 and the cathode electrode 140 due to particles in the area in which the second anode electrode 122 is provided, the transparent display panel 110 according to one embodiment of the present disclosure may be repaired by cutting the second anode connection portion ACE2 using a laser.

In the transparent display panel 110 according to one embodiment of the present disclosure, only the corresponding anode electrode among the plurality of anode electrodes 121 and 122 may be short-circuited through cutting even though a dark spot occurs by the particles, whereby a light loss rate due to occurrence of the dark spot may be reduced.

Meanwhile, in the transparent display panel 110 according to one embodiment of the present disclosure, a defect may occur in the driving transistor TR1, TR2, TR3 or TR4. When the transparent display panel 110 operates in error by the driving transistor TR1, TR2, TR3 or TR4, the transistor connection electrode TCE may be cut by a laser to electrically separate the driving transistor TR1, TR2, TR3 or TR4 and the anode electrode 120 of the corresponding subpixel from each other. Therefore, a signal applied from the driving transistor TR1, TR2, TR3 or TR4 may be blocked from being applied to the subpixel having a defect in the driving transistor TR1, TR2, TR3 or TR4, whereby the defective subpixel may not emit light.

The transparent display panel 110 according to one embodiment of the present disclosure may apply a signal of a subpixel, which is adjacent to the defective subpixel, to the defective subpixel through the repair line RL.

In detail, as shown in FIG. 8, in the transparent display panel 110 according to one embodiment of the present disclosure, the repair line RL may be provided at one side of two pixels disposed to be adjacent to each other with the first signal line SL1 interposed therebetween. The second pixel P2 may be disposed to be adjacent to the third pixel P3 with the first signal line SL1 interposed therebetween. The repair line RL may be extended from one side of the second pixel P2 to one side of the third pixel P3. At this time, the repair line RL may be extended from one side of the second pixel P2 in the second direction, and may be provided such that a branch line protruded in the first direction may partially overlap the repair connection electrode RCE of each of the subpixels SP1, SP2, SP3 and SP4 included in the second pixel P2. Also, the repair line RL may be extended from one side of the third pixel P3 in the second direction, and may be provided such that a branch line protruded in the first direction may partially overlap the repair connection electrode RCE of each of the subpixels SP1, SP2, SP3 and SP4 included in the third pixel P3.

The repair line RL may be connected to the repair connection electrode RCE through the fourth contact hole CH4. The repair connection electrode RCE may electrically be separated from the third anode connection portion ACE3 with at least one insulating layer interposed therebetween as described above. when the defective subpixel occurs, the repair connection electrode RCE and the third anode connection portion ACE3 that are electrically separated from each other may electrically be connected with each other through the repair process.

For example, when a defect occurs in the first driving transistor TR1 of the first subpixel SP1 of the second pixel P2, the transistor connection electrode TCE may be cut by a laser to electrically separate the first driving transistor TR1 of the first subpixel SP1 of the second pixel P2 from the anode electrode 120. Therefore, a signal applied from the first driving transistor TR1 may be blocked from being applied to the first subpixel SP1 of the second pixel P2 having a defect in the first driving transistor TR1, whereby the first subpixel SP1 may not emit light.

Laser may be irradiated to a welding point WP where the repair connection electrode RCE of the first subpixel SP1 of the second pixel P2 and the third anode connection portion ACE3 partially overlap each other, whereby the repair connection electrode RCE of the first subpixel SP1 of the second pixel P2 and the third anode connection portion ACE3, which are electrically separated from each other, may electrically be connected with each other. At this time, the repair line RL may be electrically connected to the third anode connection portion ACE3 of the first subpixel SP1 of the second pixel P2 through the repair connection electrode RCE.

Also, laser may be irradiated to a welding point WP where the repair connection electrode RCE of the first subpixel SP1 of the third pixel P3 and the third anode connection portion ACE3 partially overlap each other, whereby the repair connection electrode RCE of the first subpixel SP1 of the third pixel P3 and the third anode connection portion ACE3, which are electrically separated from each other, may electrically be connected with each other. At this time, the repair line RL may be electrically connected to the third anode connection portion ACE3 of the first subpixel SP1 of the third pixel P3 through the repair connection electrode RCE.

As a result, a signal of the first subpixel SP1 of the third pixel P3 may be applied to the first subpixel SP1 of the second pixel P2 having a defect.

Meanwhile, the repair line RL, as shown FIG. 9, may electrically be separated from the repair connection electrode RCE with at least one insulating layer interposed therebetween as described above. At this time, the repair connection electrode RCE may be electrically connected to the third anode connection portion ACE3 through the second contact hole CH2. When the defective subpixel occurs, the repair connection electrode RCE and the repair line RL that are electrically separated from each other may electrically be connected with each other through the repair process.

For example, when a defect occurs in the first driving transistor TR1 of the first subpixel SP1 of the second pixel P2, the transistor connection electrode TCE may be cut by a laser to electrically separate the first driving transistor TR1 of the first subpixel SP1 of the second pixel P2 from the anode electrode 120. Therefore, a signal applied from the first driving transistor TR1 may be blocked from being applied to the first subpixel SP1 of the second pixel P2 having a defect in the first driving transistor TR1, whereby the first subpixel SP1 may not emit light.

Laser may be irradiated to a welding point WP where the repair connection electrode RCE of the first subpixel SP1 of the second pixel P2 and the repair line RL partially overlap each other, whereby the repair connection electrode RCE of the first subpixel SP1 of the second pixel P2 and the repair line RL, which are electrically separated from each other, may electrically be connected with each other. Also, laser may be irradiated to a welding point WP where the repair connection electrode RCE of the first subpixel SP1 of the third pixel P3 and the repair line RL partially overlap each other, whereby the repair connection electrode RCE of the first subpixel SP1 of the third pixel P3 and the repair line RL, which are electrically separated from each other, may electrically be connected with each other. As a result, a signal of the first subpixel SP1 of the third pixel P3 may be applied to the first subpixel SP1 of the second pixel P2 having a defect.

As describe above, in the transparent display panel 110 according to one embodiment of the present disclosure, the anode connection electrode ACE may extend toward the transmissive area TA, the transistor connection electrode TCE may extend toward the transmissive area TA. Accordingly, in the transparent display panel 110 according to one embodiment of the present disclosure, the first contact hole CH1 for contacting the anode connection electrode ACE and the transistor connection electrode TCE may be disposed outside the light emission area EA. When the first contact hole CH1 is disposed in the light emission area EA, an aperture ratio loss may occur as much as an area in which the first contact hole CH1 is disposed. In the transparent display panel 110 according to one embodiment of the present disclosure, since the first contact hole CH1 connecting the anode connection electrode ACE and the transistor connection electrode TCE is formed outside the light emission area EA, it is possible to prevent a decrease in the aperture ratio of the light emission area EA by the first contact hole CH1, thereby securing a wide light emission area.

In addition, in the transparent display panel 110 according to one embodiment of the present disclosure, since the first contact hole CH1 is disposed in a dead zone between the transmission area TA and the light emission area EA, it is possible to prevent a decrease in transmittance by the first contact hole CH1. As a result, in the transparent display panel 110 according to one embodiment of the present disclosure, the first contact hole CH1 connecting the anode connection electrode ACE and the transistor connection electrode TCE may be formed without reducing both the aperture ratio of the light emission area EA and the transmittance.

Meanwhile, the transparent display panel 110 includes the repair line RL in FIGS. 4 and 9, the present disclosure is not limited thereto. The transparent display panel 110 according to another embodiment of the present disclosure may not include the repair line RL as shown in FIGS. 10 and 11. In this case, since the transparent display panel 110 does not include the repair line RL and the repair connection electrode RCE connecting the repair line RL and the anode electrode 120, it is possible to further improve the transmittance.

Referring back to FIGS. 6 to 8, the bank 125 may be provided over the planarization layer PLN. In addition, the bank 125 may be provided between the anode electrodes 120. The bank 125 may be provided to cover or at least partially cover the edges of each of the anode electrodes 120 and expose a portion of each of the anode electrodes 120. Therefore, the bank 125 may prevent light emission efficiency from being deteriorated due to a current concentrated on each end of each of the anode electrodes 120.

The bank 125 may border the light emission areas EA1, EA2, EA3 and EA4 of the subpixels SP1, SP2, SP3 and SP4. The emission areas EA1, EA2, E3 and E4 of the subpixels SP1, SP2, SP3 and SP4 indicate areas where the anode electrode 120, the organic light emitting layer 130 and the cathode electrode 140 are sequentially deposited so that holes from the anode electrode 120 and electrons from the cathode electrode 140 are combined with each other in the organic light emitting layer 130 to emit light. In this case, the area where the bank 125 is provided does not emit light and thus may be a non-emission area, and the area where the bank 125 is not provided is not provided and the anode electrode 120 is exposed may be the light emission areas EA1, EA2, EA3 and EA4.

The bank 125 may be formed of an organic film such as an acrylic resin, an epoxy resin, a phenolic resin, a polyamide resin and a polyimide resin.

The organic light emitting layer 130 may be provided over the anode electrode 120. The organic light emitting layer 130 may include a hole transporting layer, a light emitting layer and an electron transporting layer. In this case, when a voltage is applied to the anode electrode 120 and the cathode electrode 140, holes and electrons move to the light emitting layer through the hole transport layer and the electron transport layer, respectively and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, in the organic light emitting layer 130, a light emitting layer may be provided for each of the subpixels SP1, SP2, SP3 and SP4. For example, a red light emitting layer for emitting red light may be provided in the first subpixel SP1, a white light emitting layer for emitting white light may be provided in the second subpixel SP2, a blue light emitting layer for emitting blue light may be provided in the third subpixel SP3, and a green light emitting layer for emitting green light may be provided in the fourth subpixel SP4. In this case, the light emitting layer of the organic light emitting layer 130 is not provided in the transmissive area TA.

The cathode electrode 140 may be provided over the organic light emitting layer 130 and the bank 125. The cathode electrode 140 may also be provided in the transmissive area TA as well as the non-transmissive area NTA that includes a light emission area EA, but is not limited thereto. The cathode electrode 140 may be provided only in the non-transmissive area NTA that includes the light emission areas EA1, EA2, EA3 and EA4, and may not be provided in the transmissive area TA to improve transmittance.

The cathode electrode 140 may be a common layer that is commonly provided in the subpixels SP1, SP2, SP3 and SP4 to apply the same voltage. The cathode electrode 140 may be formed of a conductive material capable of transmitting light. For example, the cathode electrode 140 may be formed of a low resistance metal material such as silver (Ag) or an alloy of magnesium (Mg) and silver (Ag).

An encapsulation layer 150 may be provided over the light emitting elements. The encapsulation layer 150 may be provided over the cathode electrode 140 to overlay the cathode electrode 140. The encapsulation layer 150 serves to prevent oxygen or moisture from being permeated into the organic light emitting layer 130 and the cathode electrode 140. To this end, the encapsulation layer 150 may include at least one inorganic film and at least one organic film.

Although not shown in FIG. 6, a capping layer may further be provided between the cathode electrode 140 and the encapsulation layer 150.

A color filter CF may be provided over the encapsulation layer 150. The color filter CF may be provided over one surface of the second substrate 112 facing the first substrate 111. In this case, the first substrate 111 provided with the encapsulation layer 150 and the second substrate 112 provided with the color filter CF may be bonded to each other by a separate adhesive layer 160. The adhesive layer 160 may be an optically clear resin layer (OCR) or an optically clear adhesive film (OCA).

The color filter CF may be provided to be patterned for each of the subpixels SP1, SP2, SP3 and SP4. In detail, the color filter CF may include a first color filter CF1, a second color filter CF2, a third color filter (not shown) and a fourth color filter (not shown). The first color filter CF1 may be disposed to correspond to the light emission area EA1 of the first subpixel SP1, and may be a red color filter that transmits red light. The second color filter CF2 may be disposed to correspond to the light emission area EA2 of the second subpixel SP2, and may be a white color filter that transmits white light. The white color filter may be formed of a transparent organic material that transmits white light. The third color filter (not shown) may be disposed to correspond to the light emission area EA3 of the third subpixel SP3, and may be a blue color filter that transmits blue light. The fourth color filter (not shown) may be disposed to correspond to the light emission area EA4 of the fourth subpixel SP4, and may be a green color filter that transmits green light.

A black matrix BM may be provided between the color filters CF and between the color filter CF and the transmissive area TA. The black matrix BM may be disposed between the subpixels SP1, SP2, SP3 and SP4 to prevent color mixture between adjacent subpixels SP1, SP2, SP3 and SP4 from occurring. In addition, the black matrix BM may be disposed between the transmissive area TA and the plurality of subpixels SP1, SP2, SP3 and SP4 to prevent light emitted from each of the plurality of subpixels SP1, SP2, SP3 and SP4 from moving to the transmissive area TA.

The black matrix BM may include a material that absorbs light, for example, a black dye that absorbs most or all of the light in the visible wavelength range.

The transparent display panel 110 according to one embodiment of the present disclosure is characterized in that one transmissive area TA corresponds to two pixels P1 and P2.

In detail, in the transparent display panel 110 according to one embodiment of the present disclosure, the first pixel P1 and the second pixel P2 may be disposed between two first signal lines SL1. The first pixel P1 may be supplied with a scan signal from the first scan line SCANL1 of the first signal line SL1 disposed at the upper side, and the second pixel P2 may be supplied with a scan signal from the second scan line SCANL2 of the first signal line SL1 disposed at the lower side. In the transparent display panel 110 according to one embodiment of the present disclosure, since the scan lines SCANL1 and SCANL2 have a flip structure, the other scan lines may not pass between the first pixel P1 and the second pixel P2. As a result, in the transparent display panel 110 according to one embodiment of the present disclosure, one transmissive area TA may correspond to two pixels P1 and P2.

In the transparent display panel 110 according to one embodiment of the present disclosure, the first signal line SL1, for example, the scan lines SCANL1 and SCANL2 are not provided between the first pixel P1 and the second pixel P2, whereby a size of the transmissive area TA may be increased. When the scan lines SCANL1 and SCANL2 are provided between the first pixel P1 and the second pixel P2, the scan lines SCANL1 and SCANL2 are extended in the first direction and thus pass across the transmissive area TA. Since the scan lines SCANL1 and SCANL2 are made of an opaque conductive material, the size of the transmissive area TA is reduced as much as the area provided with the scan lines SCANL1 and SCANL2.

In the transparent display panel 110 according to one embodiment of the present disclosure, the scan lines SCANL1 and SCANL2 are formed in a flip structure, and one transmissive area TA corresponds to two pixels P1 and P2, whereby the size of the transmissive area TA may be increased. Therefore, the transparent display panel 110 according to one embodiment of the present disclosure may improve light transmittance.

In addition, in the transparent display panel 110 according to one embodiment of the present disclosure, the scan lines SCANL1 and SCANL2 are formed in a flip structure and one transmissive area TA, and one transmissive area TA corresponds to two pixels P1 and P2, whereby a first width W1 in the second direction of the transmissive area TA may be increased. As a result, the transparent display panel 110 according to one embodiment of the present disclosure may reduce a diffraction phenomenon.

According to the diffraction phenomenon, light corresponding to plane waves may be changed to spherical waves as the light passes through the slit and an interference phenomenon may occur in the spherical waves. Therefore, constructive interference and destructive interference occur in the spherical waves, whereby the external light that has passed through the slit may have irregular light intensity. As a result, in the transparent display panel 110, definition of an object or image positioned at an opposite side may be reduced.

This diffraction phenomenon may occur when the external light passes through the slit, elongated linear or rectangular transmissive area TA. At this time, according to the diffraction phenomenon, the smaller a width of the transmissive area TA is, the greater a diffraction angle is, and the greater a diffraction effect is. In the transparent display panel 110 according to one embodiment of the present disclosure, as a first width W1 in a second direction of the transmissive area TA is increased, the diffraction angle may be reduced. Therefore, the transparent display panel 110 according to one embodiment of the present disclosure may reduce the diffraction effect.

Meanwhile, in the transparent display panel 110 according to one embodiment of the present disclosure, the subpixels SP1, SP2, SP3 and SP4 included in each of the first and second pixels P1 and P2 may be disposed substantially in a line in the second direction. In this case, a single subpixel may be provided in the non-transmissive area NTA, which is provided between two transmissive areas TA adjacent to each other in the first direction (e.g., X-axis direction), in the first direction.

The second signal line SL2 and the driving transistors TR2, TR2, TR3 and TR4 may be provided in the non-transmissive area NTA provided between the two transmissive areas TA adjacent to each other in the first direction (e.g., X-axis direction). At this time, the second signal line SL2 may include a plurality of signal lines, for example, four data lines DL1, D2, DL3 and DL4, a pixel power line VDDL, a reference line REFL and a common power line VSSL.

The plurality of signal lines included in the second signal line SL2 and the driving transistors TR1, TR2, TR3 and TR4 should be spaced apart from each other in the non-transmissive area NTA. At this time, a second width W2 (see FIG. 3) in the first direction of the non-transmissive area NTA may vary depending on the arrangement of the plurality of signal lines included in the second signal line SL2 and the arrangement of the driving transistors TR1, TR2, TR3 and TR4.

The transparent display panel of the related art may include a plurality of subpixels provided in a first direction (e.g., X-axis direction) in a non-transmissive area NTA provided between two transmissive areas TA adjacent to each other in the first direction. For example, the first subpixel SP1 and the second subpixel SP2 may be provided in the non-transmissive area NTA provided between two transmissive areas TA adjacent to each other in the first direction (e.g., X-axis direction). The plurality of signal lines included in the second signal line SL2 and the first driving transistor TR1 of the first subpixel SP1 and the second driving transistor TR2 of the second subpixel SP2 should be disposed within the first width W1 in the first direction of the non-transmissive area NTA. Since there is a minimum or reduced spaced distance between the plurality of signal lines and the first driving transistor TR1 and the second driving transistor TR2, there is a limitation in reducing the first width W1 in the first direction of the non-transmissive area NTA.

On the other hand, in the transparent display panel 110 according to one embodiment of the present disclosure, only one subpixel may be provided in the first direction in the non-transmissive area NTA provided between the two transmissive areas TA adjacent to each other in the first direction (e.g., X-axis direction). For example, in the transparent display panel 110 according to one embodiment of the present disclosure, only the first subpixel SP1 may be provided in the first direction in the non-transmissive area NTA provided between the two transmissive areas TA adjacent to each other in the first direction (e.g., X-axis direction). In the transparent display panel 110 according to one embodiment of the present disclosure, since the plurality of signal lines included in the second signal line SL2 and the first driving transistor TR1 of the first subpixel SP1 are only to be disposed within the first width W1 (see FIG. 3) of the non-transmissive area NTA, the first width W1 in the first direction of the non-transmissive area NTA may be reduced in comparison with the transparent display panel 110 of the related art. In the transparent display panel 110 according to one embodiment of the present disclosure, the second width W2 in the first direction of the non-transmissive area NTA may be reduced, whereas a third width W3 (see FIG. 3) in the first direction of the transmissive area TA may be increased. In the transparent display panel 110 according to one embodiment of the present disclosure, the size of the transmissive area TA may be increased, whereby light transmittance may be improved.

Meanwhile, in the transparent display panel 110 according to one embodiment of the present disclosure, the reference line REFL may be spaced apart from the data lines DL1, DL2, DL3 and DL4 in the non-transmissive area NTA with one of the driving transistors TR1, TR2, TR3 and TR4, which is interposed therebetween.

The transparent display panel 110 may make sure of the third width W3 of the transmissive area TA at a wide width and form the second width W2 of the non-transmissive area NTA at a relatively narrow width, thereby making sure of light transmittance. The plurality of signal lines do not have transmittance, and thus may be disposed in the non-transmissive area NTA. At this time, since the plurality of signal lines are disposed in the non-transmissive area NTA having a narrow second width W2 as compared with the general display panel, a spaced distance between the signal lines has no option but to be reduced. For this reason, parasitic capacitance between the reference line REFL and the data lines DL1, DL2, DL3 and DL4 may be increased in the transparent display panel 110, and a cross talk phenomenon caused by coupling may occur more seriously.

The description will be made in more detail with reference to FIGS. 9a and 9b. Each of the subpixels SP1, SP2, SP3 and SP4 may include a first switching transistor STR1, a second switching transistor STR2, a driving transistor DTR, a capacitor Cst, and an organic light emitting diode OLED.

The first switching transistor STR1 may be switched in accordance with a scan signal Scan supplied to the scan lines SCANL1 and SCANL2 to supply a data voltage Vdata, which is supplied to the data lines DL1, DL2, DL3 and DL4, to a gate node VG of the driving transistor DTR.

The driving transistor DTR is switched in accordance with the data voltage Vdata supplied from the first switching transistor STR1 to control a data current oled flowing to the organic light emitting diode OLED by a driving voltage EVDD.

The capacitor Cst may be connected between the gate node VG of the driving transistor DTR and a source node VS to store a voltage corresponding to the data voltage Vdata supplied to the gate node VG of the driving transistor DTR, and may turns on the driving transistor DTR with the stored voltage.

The second switching transistor STR2 may be switched in accordance with the scan signal Scan supplied to the scan lines SCANL1 and SCANL2 to transfer a reference voltage Vref supplied from the reference line REFL to the source node VS of the driving transistor DTR.

The anode electrode 120 of the organic light emitting diode OLED may be connected to the source node VS of the driving transistor DTR and its cathode electrode 140 may be connected to the common power line VSSL to which a cathode voltage EVSS is applied, thereby emitting light by the data current supplied from the driving transistor DTR.

In the subpixels SP1, SP2, SP3 and SP4 having the structure as above, when the reference line REFL and the data lines DL1, DL2, DL3 and DL4 are disposed to be adjacent to each other, parasitic capacitance cap may occur between the reference line REFL and the data lines DL1, DL2, DL3 and DL4, whereby luminance of the subpixels SP1, SP2, SP3 and SP4 may be changed.

In detail, the data voltage applied to the data lines DL1, DL2, DL3 and DL4 has a pulse shape. At this time, the reference voltage Vref of the reference line REFL may instantaneously be increased, as shown in FIG. 9B at a first point 1 where the data voltage applied to the data lines DL1, DL2, DL3 and DL4 is changed from a low level to a high level. Therefore, the source node VS of the driving transistor DTR connected with the reference line REFL rises and the gate node VG of the driving transistor DTR decreases, whereby luminance of the subpixels SP1, SP2, SP3 and SP4 may be reduced.

At a second point 2 where the data voltage applied to the data lines DL1, DL2, DL3 and DL4 is changed from a high level to a low level, the reference voltage Vref of the reference line REFL may instantaneously be reduced as shown in FIG. 9B. Therefore, the source node VS of the driving transistor DTR connected with the reference line REFL is reduced and the gate node VG of the driving transistor DTR is increased, whereby luminance of the subpixels SP1, SP2, SP3 and SP4 may be increased.

In the transparent display panel 110 according to one embodiment of the present disclosure, the reference line REFL and the data lines DL1 and DL2 may not be disposed to be adjacent to each other in order to prevent parasitic capacitance from occurring between the reference line REFL and the data lines DL1, DL2, DL3 and DL4 in a limited space. In detail, in the transparent display panel 110 according to one embodiment of the present disclosure, the driving transistors TR1, TR2, TR3 and TR4 are disposed between the reference line REFL and the data lines DL1, DL2, DL3 and DL4, whereby the reference line REFL may be spaced apart from the data lines DL1, DL2, DL3 and DL4. Therefore, in the transparent display panel 110 according to one embodiment of the present disclosure, occurrence of parasitic capacitance may be minimized or reduced between the reference line REFL and the data lines DL1, DL2, DL3 and DL4.

In addition, in the transparent display panel 110 according to one embodiment of the present disclosure, the pixel power line VDDL may be disposed between the data lines DL1, DL2, DL3 and DL4 and the driving transistors TR1, TR2, TR3 and TR4.

The driving transistors TR1, TR2, TR3 and TR4 provided in each of the subpixels SP1, SP2, SP3 and SP4 may be connected with the pixel power line VDDL through a first power connection line VCL1. One end of the first power connection line VCL1 may be connected with the driving transistors TR1, TR2, TR3 and TR4 and the other end thereof may be connected with the pixel power line VDDL through a third contact hole CH3. At this time, at least a portion of the third contact hole CH3 and the first power connection line VCL1 may be disposed between the subpixels SP1, SP2, SP3 and SP4 as shown in FIG. 4. That is, in the transparent display panel 110 according to one embodiment of the present disclosure, at least a portion of the third contact hole CH3 and the first power connection line VCL1 may be disposed in an area that is not overlapped with the anode electrode 120.

In the transparent display panel 110 according to one embodiment of the present disclosure, a defect may occur in the driving transistor TR1, TR2, TR3 or TR4 of any one of the subpixels SP1, SP2, SP3 and SP4, and the first power connection line VCL1 connected with the driving transistor TR1, TR2, TR3 or TR4 having a defect may be cut by a laser, whereby connection between the driving transistor TR1, TR2, TR3 or TR4 having a defect and the pixel power line VDDL may be short-circuited.

In the transparent display panel 110 according to one embodiment of the present disclosure, at least a portion of the second contact hole CH2 and the first power connection line VCL1 may be disposed in an area that is not overlapped with the anode electrode 120, whereby the anode electrode 120 may be prevented from being damaged when the first power connection line VCL1 is cut by a laser.

Also, in the transparent display panel 110 according to one embodiment of the present disclosure, the common power line VSSL may be disposed between the data lines DL1, DL2, DL3 and DL4 and the transmissive area TA. The common power line VSSL may partially overlap the black matrix BM, which is provided between the plurality of subpixels SP1, SP2, SP3, SP4 and the transmissive area TA, along the second direction. In the transparent display panel 110 according to one embodiment of the present disclosure, the common power line VDDL is disposed between the data lines DL1, DL2, DL3 and DL4 and the transmissive area TA, whereby the pixel power line VDDL may be prevented from being overlapped with the black matrix BM, which is provided between the plurality of subpixels SP1, SP2, SP3, SP4 and the transmissive area TA, along the second direction.

The black matrix BM may be provided in the second substrate 112, and may have a structure that is more protruded than the color filter CF. When the second substrate 112 is bonded onto the first substrate 111, the elements provided over the first substrate 111 may be pressed by the black matrix BM. When the pixel power line VDDL overlaps the black matrix BM along the second direction, the pixel power line VDDL and the cathode electrode 140 may adjoin each other while being pressed by the black matrix BM, whereby a short may occur between the pixel power line VDDL and the cathode electrode 140.

In the transparent display panel 110 according to one embodiment of the present disclosure, the common power line VSSL is provided to partially overlap the black matrix BM along the second direction, whereby the transparent display panel 110 may normally be driven even though the black matrix BM is pressed.

In addition, in the transparent display panel 110 according to one embodiment of the present disclosure, the black matrix BM may not be provided between the white subpixel among the subpixels SP1, SP2, SP3 and SP4 and the transmissive area TA.

In detail, the black matrix BM may be provided between the subpixels SP1, SP2, SP3, SP4 and the transmissive area TA to prevent light emitted from each of the subpixels SP1, SP2, SP3 and SP4 from being visible as another color depending on a viewing angle. For example, light emitted from the green subpixel may be viewed as white light.

In the transparent display panel 110 according to one embodiment of the present disclosure, the black matrix BM may be provided between the subpixels SP1, SP2, SP3 and SP4 and the transmissive area TA so that light emitted from the subpixels SP1, SP2, SP3 and SP4 does not move toward a side, for example, in a direction of the transmissive area TA. However, when the black matrix BM is provided between the subpixels SP1, SP2, SP3, SP4 and the transmissive area TA, the size of the transmissive area TA is reduced, whereby light transmittance may be reduced. In the transparent display panel 110 according to one embodiment of the present disclosure, in order to minimize or reduce loss of light transmittance due to the black matrix BM, the black matrix BM may not be provided between the white subpixel and the transmissive area TA, as shown in FIG. 5.

Meanwhile, the white subpixel SP2 may increase an area of the anode electrode 120. That is, a spaced distance between the transmissive area TA and the anode electrode 120 of the white subpixel SP2 may be shorter than a spaced distance between the transmissive area TA and the anode electrode 120 of each of the other subpixels SP1, SP3 and SP4. In one embodiment, the white subpixel SP2 may match an end of the anode electrode 120 with a boundary between the transmissive area TA and the non-transmissive area NTA. As a result, the transparent display panel 110 according to one embodiment of the present disclosure may favorably make sure of afterimage lifespan by increasing an aperture ratio of the white subpixel SP2.

Also, in the transparent display panel 110 according to one embodiment of the present disclosure, a cathode contact portion CCT for connecting the common power line VSSL with the cathode electrode 140 may be disposed in the transmissive area TA.

The cathode contact portion CCT may be connected with the common power line VSSL through a second power connection line VCL2. One end of the second power connection line VCL2 may be connected with the common power line VSSL and the other end may be connected to the cathode contact portion CCT.

The second power connection line VCL2 may be protruded from the common power line VSSL, particularly from the second common power line VSSL-2 to the transmissive area TA and then extended to the cathode contact portion CCT. The cathode contact portion CCT may be formed in a polygonal shape, and may have a minimum or reduced area for stable contact with the cathode electrode 140. The cathode contact portion CCT may be exposed by an undercut structure, and may adjoin an area where the cathode electrode 140 is exposed.

In the transparent display panel 110 according to one embodiment of the present disclosure, one cathode contact portion CCT may be disposed per transmissive area TA. In the transparent display panel 110 according to one embodiment of the present disclosure, since one transmissive area TA corresponds to two pixels P, the cathode contact portion CT may also correspond to two pixels P.

The transparent display panel 110 according to one embodiment of the present disclosure may reduce the number of cathode contact portions CCT to half as compared with the transparent display panel 110 provided with one cathode contact portion CCT per pixel P. The transparent display panel 110 according to one embodiment of the present disclosure may reduce decrease in a transmissive size in the transmissive area TA by the cathode contact portion CCT to half, thereby improving transparency.

Meanwhile, in the transparent display panel 110 according to one embodiment of the present disclosure, the anode electrode 120 may include Ag in order to prevent a current density of the cathode contact portion CCT from being increased as the number of the cathode contact portions CCT is reduced to half. For example, the anode electrode 120 may be formed of a material such as a deposited structure ITO/Ag/ITO of Ag and ITO, Ag alloy, and a deposited structure ITO/Ag alloy/ITO of Ag alloy and ITO.

Since Ag has high reflectance of 90% or more, element efficiency may be improved, and thus the current of the transparent display panel 110 may be reduced. In the transparent display panel 110 according to one embodiment of the present disclosure, even though the number of the cathode contact portions CCT is reduced to half, the current of the transparent display panel 110 may be reduced, whereby the current density of the cathode contact portion CCT may not be increased.

According to the present disclosure, the following advantageous effects may be obtained.

In the present disclosure, the scan lines have a flip structure and two pixels are provided to correspond to one transmissive area, whereby the size of the transmissive area may be increased.

Also, as the plurality of subpixels are disposed substantially in a line, the width of the non-transmissive area may be reduced. Therefore, the present disclosure may make sure of a maximum or increased size of the transmissive area and improve transparency.

Also, the present disclosure may reduce a diffraction angle of light passing through the transmissive area by increasing the width of the transmissive area. Therefore, the present disclosure may reduce the diffraction effect and improve definition.

Also, in the present disclosure, the driving transistor is disposed between the reference line and the data line, whereby the reference line and the data line may be spaced apart from each other. Therefore, the present disclosure may minimize or reduce occurrence of parasitic capacitance between the reference line and the data line.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
a substrate;
a first signal line provided on the substrate and extended in a first direction;
a second signal line provided on the substrate and extended in a second direction; and
a first pixel including a first subpixel, a second subpixel and a third subpixel, wherein the first subpixel, the second subpixel and the third subpixel are overlapped with at least a portion of the second signal line and disposed substantially in a line in the second direction,
wherein each of the first subpixel, the second subpixel, and the third subpixel includes:
a light emitting device comprising an anode electrode including a first anode electrode and a second anode electrode, and
an anode connection electrode connecting the first anode electrode and the second anode electrode,
wherein the first anode electrode and the second anode electrode are disposed directly on a same layer,
wherein the second signal line includes a plurality of data lines, a pixel power line, and a common power line,
wherein the first subpixel, the second subpixel, and the third subpixel are respectively connected to different data lines,
a light shielding layer disposed on the substrate;
a plurality of driving transistors disposed on the light shielding layer; and
a planarization layer disposed on the plurality of driving transistors;
wherein the first anode electrode, the second anode electrode, and the anode connection electrode are directly disposed on the planarization layer, and
wherein the data lines, the pixel power line, the common power line, the light shielding layer are directly disposed on a same layer on the substrate.

2. The transparent display device of claim 1, further comprising a second pixel disposed adjacent to the first pixel,
wherein the second pixel includes a first subpixel, a second subpixel and a third subpixel,
wherein the first subpixel, the second subpixel and the third subpixel of the second pixel are overlapped with at least a portion of the second signal line and disposed substantially in a line in the second direction,
wherein the first pixel and the second pixel are disposed adjacent to each other in the second direction.

3. The transparent display device of claim 2,
wherein the substrate having transmissive areas and a non-transmissive area disposed between the transmissive areas;
wherein the first signal line and the second signal line are provided in the non-transmissive area; and
wherein the first signal line includes two scan lines disposed between the transmissive areas.

4. The transparent display device of claim 3, wherein the first pixel and the second pixel are disposed between a first scan line and a second scan line, the first scan line being configured to supply a scan signal to the first pixel, the second scan line being configured to supply a scan signal to the second pixel.

5. The transparent display device of claim 3, wherein the first pixel is configured to be supplied with a scan signal from a first scan line, the first scan line being disposed on a first side of a transmissive area of the transmissive areas, and
the second pixel is configured to be supplied with a scan signal from a second scan line, the second scan line being disposed on a second side of the transmissive area, the second side facing the first side.

6. The transparent display device of claim 1, wherein each of the plurality of driving transistors is provided in a respective one of the first subpixel, the second subpixel and the third subpixel,
wherein the second signal line further includes a reference line, and the reference line and the plurality of data lines are disposed to be spaced apart from each other with the plurality of driving transistors interposed therebetween.

7. The transparent display device of claim 6, wherein the pixel power line is disposed between the plurality of data lines and the plurality of driving transistors.

8. The transparent display device of claim 7, further comprising a plurality of power connection lines, each of the plurality of power connection lines including:

one end coupled to one of the plurality of driving transistors; and another end coupled to the pixel power line through a first contact hole;

wherein at least a portion of the first contact hole and at least a portion of the power connection line are provided between two subpixels of the first subpixel, the second subpixel and the third subpixel.

9. The transparent display device of claim 3, further comprising a black matrix disposed between the first subpixel, the second subpixel and the third subpixel of the first pixel, and between at least one of the first subpixel, the second subpixel or the third subpixel and the transmissive area.

10. The transparent display device of claim 9, wherein the second signal line includes a common power line, and the common power line partially overlaps the black matrix provided between the at least one of the first subpixel, the second subpixel or the third subpixel and the transmissive area.

11. The transparent display device of claim 10, further comprising a plurality of cathode contact portions, each of the plurality of the cathode contact portion being disposed in the transmissive area, the cathode contact portion being configured to couple the common power line with a cathode electrode, wherein the cathode contact portions are disposed one to one with the transmissive areas.

12. The transparent display device of claim 9, wherein one of the first subpixel, the second subpixel and the third subpixel is a white subpixel configured to emit white light, and the black matrix is not provided between the white subpixel and the transmissive area.

13. The transparent display device of claim 12, wherein the light emitting device further comprises:

a light emitting layer provided over the anode electrode, and a cathode electrode provided over the light emitting layer, and wherein a spaced distance between the anode electrode and the transmissive area in the white subpixel is shorter than a spaced distance between the anode electrode and the transmissive area in other subpixels.

14. The transparent display device of claim 3, wherein each of the first subpixel, the second subpixel and the third subpixel further includes:

the driving transistor disposed in the non-transmissive area and including an active layer, a gate electrode, a source electrode and a drain electrode; and a transistor connection electrode extending from the source electrode or the drain electrode of the driving transistor toward the transmission area and connected to the anode connection electrode through a second contact hole.

15. The transparent display device of claim 14, wherein the anode connection electrode includes:

a first anode connection portion extending from the first anode electrode toward the transmission area;

a second anode connection portion extending from the second anode electrode toward the transmission area; and a third anode connection portion connecting one end of the first anode connection portion and one end of the second anode connection portion.

16. The transparent display device of claim 15, wherein the transistor connection electrode overlaps at least a portion of the third anode connection portion and is connected to the third anode connection portion through the second contact hole.

17. The transparent display device of claim 14, further comprising:

a third pixel disposed adjacent to the second pixel, the first signal line being interposed between the third pixel and the second pixel, the third pixel including a first subpixel, a second subpixel and a third subpixel disposed substantially in a line in the second direction; and a repair line extended from one side of the second pixel to one side of the third pixel.

18. The transparent display device of claim 17, further comprising:

a repair connection electrode having one end connected to the repair line through a third contact hole and another end overlapping the anode connection electrode, wherein the repair connection electrode is electrically separated from the anode connection electrode with at least one insulating layer interposed therebetween.

19. A transparent display device comprising:

a substrate;

a first signal line provided on the substrate and extended in a first direction;

a second signal line provided on the substrate and extended in a second direction; and a plurality of pixels including a plurality of subpixels, the plurality of subpixels being overlapped with at least a portion of the second signal line and being disposed substantially in a line in the second direction, wherein each of the plurality of subpixels includes:

a light emitting device comprising an anode electrode including a first anode electrode and a second anode electrode, and an anode connection electrode connecting the first anode electrode and the second anode electrode, wherein the first anode electrode and the second anode electrode are disposed on a same layer, wherein the second signal line includes a plurality of data lines, a pixel power line, and a common power line, and wherein the plurality of subpixels included in one pixel are respectively connected to different data lines, a light shielding layer disposed on the substrate;

a plurality of driving transistors disposed on the light shielding layer; and a planarization layer disposed on the plurality of driving transistors;

wherein the first anode electrode, the second anode electrode, and the anode connection electrode are directly disposed on the planarization layer, and wherein the data lines, the pixel power line, the common power line, the light shielding layer are directly disposed on a same layer.

20. The transparent display device of claim 19, wherein the substrate having transmissive areas and a non-transmissive area disposed between the transmissive areas, wherein the first signal line and the second signal line are provided in the non-transmissive area, wherein each of the transmissive areas corresponds to a respective two pixels of the plurality of pixels, wherein each of the plurality of pixels is disposed to be adjacent in the second direction to at least one other pixel of the plurality of pixels.

21. The transparent display device of claim 20, wherein the first signal line includes a first scan line and a second scan line, the first scan line and the second scan line being disposed between the transmissive areas.

22. The transparent display device of claim 21, wherein the first scan line is configured to supply a scan signal to one of the plurality of pixels disposed at a lower side, and the second scan line is configured to supply a scan signal to one of the plurality of pixels disposed at an upper side.

23. The transparent display device of claim 21, wherein each of the plurality of driving transistors is provided in each of the plurality of subpixels, wherein the second signal line further includes a reference line, and the reference line and the plurality of data lines are disposed to be spaced apart from each other with the driving transistor interposed therebetween.

24. The transparent display device of claim 23, wherein:

the pixel power line is disposed between the plurality of data lines and the plurality of driving transistors; and the common power line is disposed between the plurality of data lines and one of the transmissive areas.

25. The transparent display device of claim 24, further comprising:

a cathode contact portion disposed in the transmissive area, the cathode contact portion coupling the common power line with a cathode electrode, wherein two pixels of the plurality of pixels share the cathode contact portion.

26. The transparent display device of claim 24, further comprising a black matrix disposed between the plurality of pixels and the transmissive area and between the plurality of subpixels, wherein the common power line partially overlaps the black matrix along the second direction.

27. The transparent display device of claim 26, wherein at least one of the plurality of subpixels is a white subpixel configured to emit white light, and the black matrix is not provided between the white subpixel and the transmissive area.

* * * * *